United States Patent [19]

Saitoh et al.

[11] Patent Number: 4,532,198

[45] Date of Patent: Jul. 30, 1985

[54] PHOTOCONDUCTIVE MEMBER

[75] Inventors: Keishi Saitoh, Tokyo; Kozo Arao, Yokohama, both of Japan

[73] Assignee: Canon Kabushiki Kaisha, Tokyo, Japan

[21] Appl. No.: 607,565

[22] Filed: May 7, 1984

[30] Foreign Application Priority Data

| | | | |
|---|---|---|---|
| May 9, 1983 | [JP] | Japan | 58-81107 |
| May 10, 1983 | [JP] | Japan | 58-81133 |
| Jun. 1, 1983 | [JP] | Japan | 58-97179 |

[51] Int. Cl.³ .......... G03G 5/08; G03G 5/082; B05D 5/12; H01L 45/00

[52] U.S. Cl. .......... 430/84; 252/501.1; 357/2; 427/74; 430/57; 430/60; 430/63; 430/65; 430/66; 430/67

[58] Field of Search .......... 430/57, 60, 63, 65, 430/66, 67, 84; 427/74; 357/2; 252/501.1

[56] References Cited

U.S. PATENT DOCUMENTS

| | | | |
|---|---|---|---|
| 3,647,427 | 3/1972 | Hanada et al. | 430/67 X |
| 4,341,851 | 7/1982 | Mooney et al. | 430/60 |
| 4,342,044 | 7/1982 | Ovshinsky et al. | 357/2 |
| 4,343,881 | 8/1982 | Sher et al. | 430/57 |
| 4,365,013 | 12/1982 | Ishioka et al. | 427/74 X |
| 4,402,762 | 9/1983 | John et al. | 357/2 X |
| 4,414,319 | 11/1983 | Shirai et al. | 430/66 X |
| 4,415,760 | 11/1983 | Madan | 357/2 X |
| 4,448,801 | 5/1984 | Fukuda et al. | 427/74 X |
| 4,460,669 | 7/1984 | Ogawa et al. | 427/74 X |
| 4,460,670 | 7/1984 | Ogawa et al. | 427/74 X |
| 4,471,042 | 9/1984 | Komatsu et al. | 430/67 X |
| 4,491,626 | 1/1985 | Kawamura et al. | 430/69 |

FOREIGN PATENT DOCUMENTS

| | | | |
|---|---|---|---|
| 0145541 | 11/1979 | Japan | 430/66 |
| 0115552 | 7/1982 | Japan | 430/66 |
| 0088753 | 5/1983 | Japan | 430/67 |
| 0187941 | 11/1983 | Japan | 430/57 |
| 0187935 | 11/1983 | Japan | 430/57 |
| 0187939 | 11/1983 | Japan | 430/57 |

*Primary Examiner*—John E. Kittle
*Assistant Examiner*—Mukund J. Shah
*Attorney, Agent, or Firm*—Fitzpatrick, Cella, Harper & Scinto

[57] ABSTRACT

A photoconductive member is provided, which comprises a support for photoconductive member and a light receiving layer with a layer constitution, comprising a first layer region containing at least germanium atoms of which at least a portion is crystallized, a second region comprising an amorphous material containing at least silicon atoms and germanium atoms, a third layer region comprising an amorphous material containing at least silicon atoms and exhibiting photoconductivity, and a fourth layer region comprising an amorphous material containing silicon atoms and carbon atoms, provided successively in the order mentioned from the said support side.

19 Claims, 18 Drawing Figures

PHOTOCONDUCTIVE MEMBER

BACKGROUND OF THE INVENTION

1. Field of the Invention

This invention relates to a photoconductive member having sensitivity to electromagnetic waves such as light [herein used in a broad sense, including ultraviolet rays, visible light, infrared rays, X-rays and gamma-rays].

2. Description of the Prior Arts

Photoconductive materials, which constitute image forming members for electrophotography in solid state image pick-up devices or in the field of image formation, or photoconductive layers in manuscript reading devices, are required to have a high sensitivity, a high SN ratio [Photocurrent ($I_p$)/Dark current ($I_d$)], spectral characteristics matching to those of electromagnetic waves to be irradiated, a rapid response to light, a desired dark resistance value as well as no harm to human bodies during usage. Further, in a solid state image pick-up device, it is also required that the residual image should easily be treated within a predetermined time. In particular, in case of an image forming member for electrophotography to be assembled in an electrophotographic device to be used in an office as office apparatus, the aforesaid harmless characteristic is very important.

From the standpoint as mentioned above, amorphous silicon [hereinafter referred to as a-Si] has recently attracted attention as a photoconductive material. For example, German Laid-Open Patent Publication Nos. 2746967 and 2855718 disclose applications of a-Si for use in image forming members for electrophotography, and German Laid-Open Patent Publication No. 2933411 an application of a-Si for use in a photoconverting reading device.

However, under the present situation, while the photoconductive members having photoconductive layers constituted of a-Si have been attempted to be improved in various aspects individually including electrical, optical and photoconductive characteristics such as dark resistance value, photosensitivity and response to light, etc., and environmental characteristics during use such as humidity resistance, and further stability with lapse of time and durability, there remains room for further improvement of overall characteristics.

For instance, when applied in an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused various inconveniences such as accumulation of fatigues by repeated uses or so called ghost phenomenon wherein residual images are formed.

Further, a-Si has a relatively smaller coefficient of absorption in the wavelength region longer than the longer wavelength region as compared with the shorter wavelength region of the visible light region and, in matching to the semiconductor laser practically applied at present time, when using a conventionally used halogen lamp or fluorescent lamp, there remains room for improvement in that the light on the longer wavelength side cannot effectively used.

As another disadvantage, if the light irradiated cannot sufficiently be absorbed but the amount of light reaching the support is increased, when the support itself has a high reflectance against the light transmitted through the photoconductive layer, interference by multiple reflection occurs in the photoconductive layer, which may become a cause for generation of "unfocused" image.

This effect is greater as the irradiated spot is made smaller for the purpose of enhancing resolution, posing a great problem particularly when using a semiconductor laser as the light source.

On the other hand, it is also proposed to provide a light receiving layer constituted of an amorphous material containing at least germanium atoms on a support in consideration of matching to a semiconductor laser. In this case, however, problems may sometimes be ensued with respect to adhesion between the support and the above light receiving layer, and diffusion of impurities from the support to the light receiving layer.

Alternatively, in the case of constituting a photoconductive layer of a-Si material, other atoms such as hydrogen atoms or halogen atoms such as fluorine atoms, chlorine atoms, etc. are contained in the photoconductive layer for improving their electrical, photoconductive characteristics; boron atoms, phosphorus atoms, etc. for controlling the electroconductivity; and other atoms for improving other characteristics as constituent atoms, respectively. Depending on the manner in which these constituent atoms are contained, there may sometimes be caused problems with respect to electrical, photoconductive characteristics or dielectric strength.

For example, when used as an image forming member for electrophotography, the life of the photocarriers generated by light irradiation in the photoconductive layer formed is insufficient, or at the dark portion, the charges injected from the support side cannot sufficiently be impeded, or there occurs image defects commonly called as "white dropout" on the images transferred on a transfer paper which may be considered to be due to the local discharge destroying phenomenon, or so called image defects commonly called as "white streaks", which may be considered to be caused by, for example, scraping with a blade employed for cleaning. Also, when used in a highly humid atmosphere or immediately after being left to stand in a highly humid atmosphere for a long time, so called "unfocused" image was frequently observed.

Thus, it is required in designing of a photoconductive material to make efforts to solve all of the problems as mentioned above along with the improvement of a-Si materials per se.

In view of the above points, the present invention contemplates the achievement obtained as a result of extensive studies made comprehensively from the standpoints of applicability and utility of a-Si as a photoconductive member for image forming members for electrophotography, solid state image pick-up devices, reading devices, etc. It has now been found that a photoconductive member having a photoconductive layer comprising an amorphous layer exhibiting photoconductivity, which is constituted of a-Si, particularly so called hydrogenated amorphous silicon, halogenated amorphous silicon or halogen-containing hydrogenated amorphous silicon which is an amorphous material containing at least one of hydrogen atom (H) and halogen atom (X) in a matrix of silicon atoms [hereinafter referred to comprehensively as a-Si(H,X)], said photoconductive member being prepared by designing so as to have a specific structure, is found to exhibit not only practically extremely excellent characteristics but also surpass the photoconductive members of the prior art in substantially all respects, especially markedly excellent characteristics as a photoconductive member for electrophotography. The present invention is based on such finding.

SUMMARY OF THE INVENTION

A primary object of the present invention is to provide a photoconductive member having electrical, optical and photoconductive characteristics which are substantially constantly stable with virtually no dependence on the environments under use, which member is markedly excellent in photosensitivity characteristics in longer wavelength range, light fatigue resistance and also excellent in humidity resistance and durability without causing deterioration phenomenon when used repeatedly, exhibiting no or substantially no residual potential observed.

Another object of the present invention is to provide a photoconductive member which is high in photosensitivity in all visible light regions, particularly excellent in matching to a semiconductor laser and rapid in light response.

Another object of the present invention is to provide a photoconductive member having a sufficient ability to retain charges during charging treatment for formation of electrostatic images, when applied as a member for formation of an electrophotographic image and having excellent electrophotographic characteristics, for which ordinary electrophotographic methods can very effectively be applied.

Still another object of the present invention is to provide a photoconductive member for electrophotography capable of providing easily a high quality image which is high in density, clear in halftone and high in resolution.

Further, still another object of the present invention is to provide a photoconductive member having a high photosensitivity, and a high SN ratio characteristic.

According to one aspect of the present invention, there is provided a photoconductive member, comprising a support for photoconductive member and a light receiving layer with a layer constitution, comprising a first layer region containing at least germanium atoms of which at least a portion is crystallized, a second region comprising an amorphous material containing at least silicon atoms and germanium atoms, a third layer region comprising an amorphous material containing at least silicon atoms and exhibiting photoconductivity, and a fourth layer region comprising an amorphous material containing silicon atoms and carbon atoms provided successively in the order mentioned from the said support side.

According to another aspect of the present invention, there is provided a photoconductive member, comprising a support for photoconductive member and a light receiving layer with a layer constitution, comprising a first layer region containing at least germanium atoms of which at least a portion is crystallized, a second region comprising an amorphous material containing at least silicon atoms and germanium atoms, a third layer region comprising an amorphous material containing at least silicon atoms and exhibiting photoconductivity, and a fourth layer region comprising an amorphous material containing silicon atoms and carbon atoms provided successively in the order mentioned from the said support side, the germanium atoms in at least said second layer region being distributed unevenly in the layer thickness direction.

According to still another aspect of the present invention, there is provided a photoconductive member, comprising a support for photoconductive member and a light receiving layer with a layer constitution, comprising a first layer region containing at least germanium atoms of which at least a portion is crystallized, a second region comprising an amorphous material containing at least silicon atoms and germanium atoms, a third layer region comprising an amorphous material containing at least silicon atoms and exhibiting photoconductivity, and a fourth layer region comprising an amorphous material containing silicon atoms and carbon atoms provided successively in the order mentioned from the said support side, either one of said first layer region and second layer region containing a substance which controls conductivity.

DETAILED DESCRIPTION OF THE PREFERRED EMBODIMENTS

Figure 1:
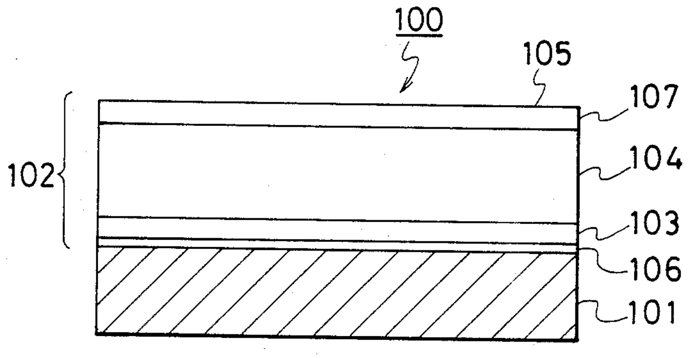
FIG. 1 shows a schematic sectional view for illustration of a preferred embodiments of the constitution of the photoconductive member according to the present invention.

Referring now to the drawings, the photoconductive member of the present invention is to be described in detail.

FIG. 1 shows a schematic sectional view for illustration of a first embodiment of the photoconductive member of this invention.

The photoconductive member 100 as shown in FIG. 1 has a support 101 for photoconductive member and a light receiving layer 102 provided on the support, said light receiving layer 102 having a free surface 105 on the end surface.

The light receiving layer 102 has a layer constitution comprising, successively laminated from the support side 101, a first layer region (C) 106 constituted of a material comprising a matrix of germanium atoms or a matrix of germanium atoms and silicon atoms, optionally containing hydrogen atoms or halogen atoms, of which at least a portion is crystallized (hereinafter written as "$\mu$c-Ge(Si,H,X)", a second layer region (G) 103 constituted of a-Si(H,X) containing germanium atoms (hereinafter abbreviated as "a-SiGe(H,X)", a third layer region (S) 104 constituted of a-Si, preferably a-Si(H,X), having photoconductivity and a fourth layer region (M) 107 constituted of an amorphous material containing silicon atoms and carbon atoms, optionally together with hydrogen atoms or/and halogen atoms (hereinafter abbreviated as $a-(Si_{1-x}C_x)_Y(H,X)_{1-y}$.

When the first layer region (C) is constituted of a material comprising a matrix of germanium atoms and silicon atoms, the germanium atoms and the silicon atoms may be contained so that they are continuous in said first layer region (C) in the layer thickness direction and the direction within the plane parallel to the surface of the support and distributed evenly, or distributed unevenly in the layer thickness direction.

The germanium atoms contained in the second layer region (G) 103 may be contained in said second layer region (G) 103 so that they are continuous in said second layer region (C) in the layer thickness direction and the direction within the plane parallel to the surface of the support and distributed evenly, or distributed unevenly in the layer thickness direction.

In the case where the distribution of germanium atoms contained in the second layer region (G) 103 is uneven in the layer thickness direction, it is desirable that the germanium atoms contained in the layer region (G) 103 should be continuous in the layer thickness direction and distributed to be more enriched on the side of the aforesaid support side 101 relative to the opposite to the side where the aforesaid support is provided (the side of the surface 105 of the light receiving layer 102).

On the other hand, in the case where the first layer region (C) 106 is constituted of a material comprising a matrix containing also silicon atoms in addition to germanium atoms and the germanium atoms is distributed unevenly in the layer thickness direction, it is desirable that the germanium atoms contained in the first layer region (C) 106 should be contained with an uneven distribution so as to be more enriched on the side of the support 101 similarly as in the case of the second layer region (G) 103. Further, in such a case, in the first layer region (C) 106 and the second layer region (G) 103, the distribution of germanium atoms should preferably be such that they are continuously and evenly distributed in the plane in the direction parallel to the surface of the support 101, and continuously and more enriched toward the side of the support 101 throughout the first layer region (C) 106 and the second layer region (G) 103.

Within the first layer region (C) 106, due to smaller coefficient of diffusion of impurities than in the second layer region (G) 103 and the third layer region (S), it is possible to prevent diffusion of impurities from the support 101 to the second layer region (G) 103.

In the present invention, no germanium atom is contained in the third layer region (S) provided on the second layer region (G), and by forming an amorphous layer to such a structure, there can be obtained a photosensitive member which is excellent in photosensitivity to the light with wavelengths over all the region from short wavelength to relatively longer wavelength.

In the case where the germanium atoms are distributed in the first layer region (C) in such a state that the germanium atoms are continuously distributed throughout the entire layer region, when using a light source such as semiconductor laser, the light on the longer wavelength side which cannot substantially be absorbed by the second layer region (G) can be substantially completely absorbed in the first layer region (C), whereby the interference by reflection from the support surface can be prevented.

On the other hand, in the case where the germanium atoms in the first layer region (C) and in the second layer region (G) are distributed in a state such that the germanium atoms are continuously distributed, with a change of the distribution concentration C in the layer thickness of germanium atoms being reduced from the support side toward the third layer region (S), affinity between the first layer region (C) and the second layer region (G) is excellent, and by making the distribution concentration C of germanium atoms extremely greater at the end of the support side, the light on the longer wavelength side which cannot substantially be absorbed by the third layer region (S) can be substantially completely absorbed in the second layer region (G), whereby the interference by reflection from the support surface can be prevented.

In the photoconductive member of the present invention, since each of the materials constituting the second layer region (G) and the third layer region (S) contains common constituent elements of silicon atoms, chemical stability can sufficiently be ensured at the laminated interface.

In the present invention, the content of germanium atoms contained in the first layer region (C) can be determined as desired so that the objects of the present invention can be accomplished effectively, but generally 1 to $1\times10^6$ atomic ppm, preferably 100 to $1\times10^6$ atomic ppm, most preferably 500 to $1\times10^6$ atomic ppm.

In the present invention, the content of germanium atoms contained in the second layer region (G) may be determined as desired so that the objects of the present invention may effectively be accomplished, but preferably 1 to $9.5\times10^5$ atomic ppm, more preferably 100 to $8\times10^5$ atomic ppm, most preferably 500 to $7\times10^5$ atomic ppm.

FIGS. 2 through 10 show typical examples of nonuniform distribution in the direction of layer thickness of germanium atoms contained in the second layer region (G).

In FIGS. 2 through 10, the axis of abscissa indicates the content C of germanium atoms and the axis of ordinate the layer thirckness of the second layer region (G), $t_B$ showing the position of the end surface of the second layer region (G) on the support side and $t_T$ the position of the end surface of the second layer region (G) on the side opposite to the support side. That is, layer formation of the second layer region (G) containing germanium proceeds from the $t_B$ side toward the $t_T$ side.

Figure 2:
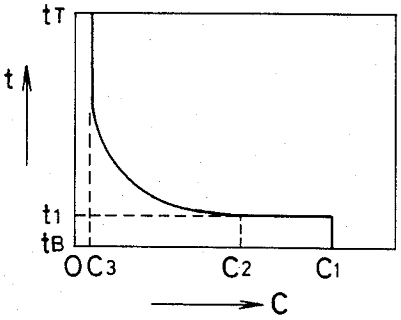
FIG. 2 through FIG. 10 show schematic charts for illustration of the depth profiles of germanium atoms in the second layer region, respectively.

In FIG. 2, there is shown a first typical embodiment of the depth profile of germanium atoms in the layer thickness direction contained in the second layer region (G).

$t_B$ shows the interface position between the first layer region (C) and the second layer region (G), and $t_T$ shows the interface position between the second layer region (G) and the third layer region (S).

From $t_B$ to the position $t_1$, while the concentration of germanium atoms taking a constant value of $C_1$, which concentration is gradually decreased continuously from the position $t_1$ to the interface position $t_T$. At the interface position $t_T$, the concentration of germanium atoms is made $C_3$.

Figure 3:
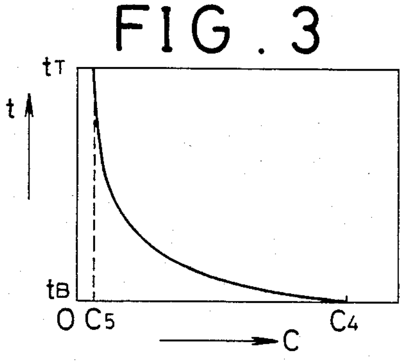

In the embodiment shown in FIG. 3, the concentration C of germanium atoms contained is decreased gradually and continuously from the position $t_B$ to the position $t_T$ from the concentration $C_4$ until it becomes the concentration $C_5$ at the position $t_T$.

Figure 4:
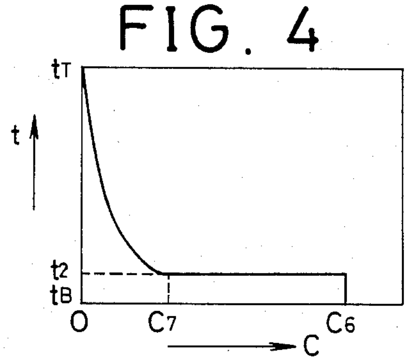

In the case of FIG. 4, the concentration C of germanium atoms is made constant as $C_6$ from $t_B$ to the position $t_2$, gradually decreased from the position $t_2$ to the position $t_T$, and the concentration C is made substantially zero at the position $t_T$ ("substantially zero" herein means the content less than the detectable limit).

Figure 5:
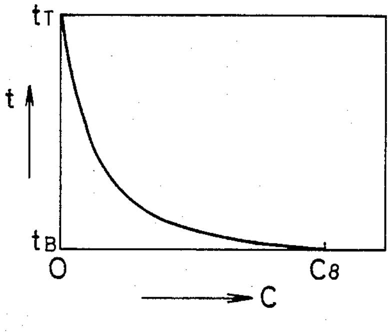

In case of FIG. 5, germanium atoms are decreased gradually and continuously from the position $t_B$ to the position $t_T$ from the concentration $C_8$, until it is made substantially zero at the position $t_T$.

Figure 6:
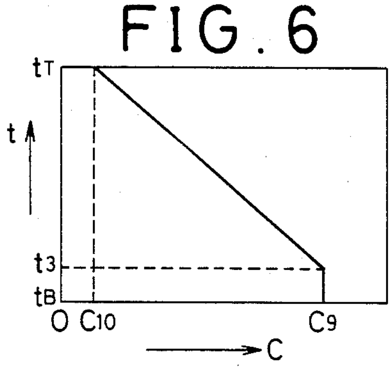

In the embodiment shown in FIG. 6, the concentration C of germanium atoms is constantly $C_9$ between the position $t_B$ and the position $t_3$, and it is made $C_{10}$ at the position $t_T$. Between the position $t_3$ and the position $t_T$, the concentration is decreased as a first order function from the position $t_3$ to the position $t_T$.

Figure 7:
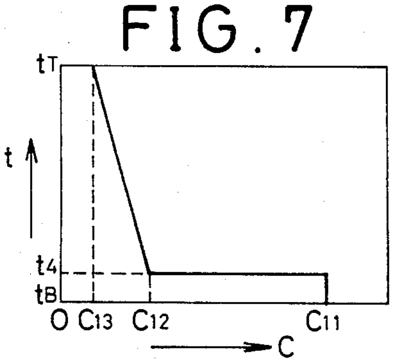

In the embodiment shown in FIG. 7, there is formed a depth profile such that the concentration C takes a constant value of $C_{11}$ from the position $t_B$ to the position $t_4$, and is decreased as a first order function from the concentration $C_{12}$ to the concentration $C_{13}$ from the position $t_4$ to the position $t_T$.

Figure 8:
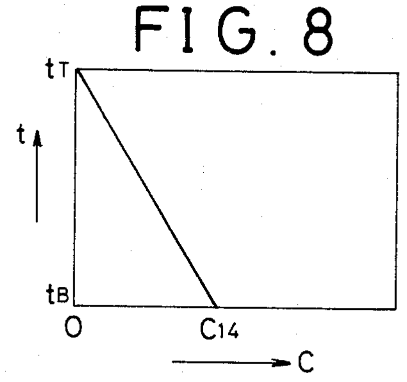

In the embodiment shown in FIG. 8, the concentration C of germanium atoms is decreased as a first order function from the concentration $C_{14}$ to zero from the position $t_B$ to the position $t_T$.

Figure 9:
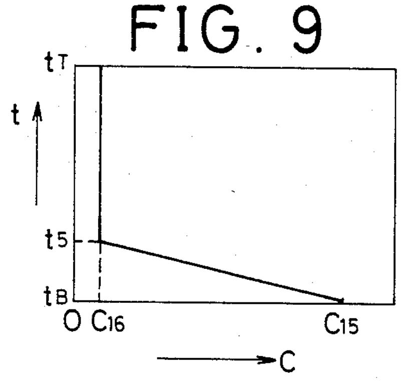

In FIG. 9, there is shown an embodiment, where the concentration C of germanium atoms is decreased as a first order function from the concentration $C_{15}$ to $C_{16}$ from the position $t_B$ to $t_T$ and made constantly at the concentration $C_{16}$ between the position $t_5$ and $t_T$.

Figure 10:
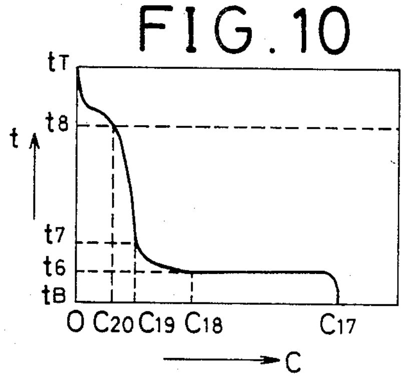

In the embodiment shown in FIG. 10, the concentration C of germanium atoms is at the concentration $C_{17}$ at the position $t_B$, which concentration $C_{17}$ is initially decreased gradually and abruptly near the position $t_6$, until it is made the concentration $C_{18}$ at the position $t_6$.

Between the position $t_6$ and the position $t_7$, the concentration is initially decreased abruptly and thereafter gradually, until it is made the concentration $C_{19}$ at the position $t_7$. Between the position $t_7$ and the position $t_8$, the concentration is decreased very gradually to the concentration $C_{20}$ at the position $t_8$. Between the position $t_8$ and the position $t_T$, the concentration is decreased along the curve having a shape as shown in the Figure from the concentration $C_{20}$ to substantially zero.

As described above about some typical examples of depth profiles of germanium atoms contained in the second layer region (G) in the direction of the layer thickness by referring to FIGS. 2 through 10, in the present invention, the second layer region (G) is provided desirably in a depth profile so as to have a portion enriched in concentration C of germanium atoms on the support side and a portion on the interface $t_T$ side depleted in concentration C of germanium atoms to considerably lower than that of the support side.

Having described above about the nonuniform distribution of germanium atoms contained in the second layer region (G), the same explanation is applicable also in the case where germanium atoms are contained in the first layer region (C) and the second layer region (G) unevenly in the layer thickness direction. That is, in the explanation in FIGS. 2 to 10, the layer thickness ($t_Bt_T$) was made the thickness of the second layer region (G), but when germanium atoms are contained in the first layer region (C) and the second layer region (G) unevenly in the layer thickness direction, the layer thickness ($t_Bt_T$) is explained as the sum of the layer thicknesses of the two layer regions. In each Figure, the interface position $t_s$ may be selected at any desired position from $t_B$ to $t_T$.

The second layer region (G) constituting the light receiving layer of the photoconductive member in the present invention, when the first layer region (C) contains no silicon atom, should desirably have a localized region (A) containing germanium atoms at a relatively high concentration preferably on the support side.

The localized region (A), may be desirably provided in the second layer region (G) within a depth of 5μ from the interface position $t_s$ between the first layer region (C) and the second layer region (G).

In the present invention, the above localized region (A) may be made to be identical with the whole layer region ($L_T$) up to the depth of 5μ thickness, or alternatively a part of the layer region ($L_T$).

It may suitably be determined depending on the characteristics required for the light receiving layer to be formed, whether the localized region (A) is made a part or whole of the layer region ($L_T$).

The localized region (A) may preferably be formed according to such a layer formation that the maximum $C_{max}$ of the concentrations of germanium atoms in a distribution in the layer thickness direction may preferably be 1000 atomic ppm or more, more preferably 5000 atomic ppm or more, most preferably $1\times10^4$ atomic ppm or more.

That is, according to the present invention, the light receiving layer containing germanium atoms is formed so that the maximum value $C_{max}$ of the depth profile may exist within the second layer region (G) thickness of 5μ from the support side (the layer region within 5μ thickness from $t_s$).

In the present invention, when the first layer region (C) contains silicon atoms, the same idea as described above may be applicable by taking the layer thickness ($t_Bt_T$) in FIGS. 2 to 10 as the sum of the layer thicknesses of the first layer region (C) and the second layer region (G) and the standard for the position where the localized region (A) exists as $t_B$ (in this case, the end face of the first layer region on the support side).

In the present invention, sufficient care should be paid in designing of the photoconductive member to the layer thicknesses of the first layer region (G) and the second layer region (G), which are one of important factors to accomplish effectively the objects of the present invention, so that desired characteristics may sufficiently given to the photoconductive member formed.

In the present invention, the layer thickness $T_c$ of the first layer region (C) should preferably be 30 Å to 50μ, more preferably 100 Å to 30μ, most preferably 500 Å to 20μ.

On the other hand, the layer thickness $T_B$ of the second layer region (G) should preferably be 30 Å to 50μ, more preferably 40 Å to 40μ, most preferably 50 Å to 30μ.

Further, the layer thickness T of the third layer region (S) should preferably be 0.5 to 90μ, more preferably 1 to 80μ, most preferably 2 to 50μ.

The sum of the layer thickness $T_B$ of the second layer region (G) and the thickness T of the third layer region (S), namely ($T_B+T$) is determined suitably as desired during layer design of the photoconductive member, based on the relationships mutually between the characteristics required for the both layer regions and the characteristics required for the light receiving layer as a whole.

In the photoconductive member, the numerical range of the above ($T_B+T$) may preferably be 1 to 100μ, more preferably 1 to 80μ, most preferably 2 to 50μ.

In more preferable embodiments of the present invention, it is desirable to select suitably appropriate numerical values for the above layer thicknesses $T_B$ and T, while satisfying preferably the relation of $T_B/T\leqq 1$.

In selection of the numerical values of the layer thickness $T_B$ and the layer thickness T in the above-mentioned case, the values of the layer thickness $T_B$ and the layer thickness T should desirably be determined, while satisfying more preferably the relation of $T_B/T \leqq 0.9$, most preferably the relation of $T_B/T \leqq 0.8$.

In the present invention, when the content of the germanium atoms in the second layer region (G) is $1 \times 10^5$ atomic ppm or more, the layer thickness $T_B$ of the second layer region (G) is desired to be made considerably thin, preferably 30μ or less, more preferably 25μ or less, most preferably 20μ or less.

Also, in the photoconductive member 100, a substance (D) for controlling the conductive characteristics should preferably be incorporated at least in either the first layer region (C) 106 or the second layer region (G) 103, to impart desired conductive characterictics especially to the second layer region (G).

In the present invention, the substance (D) for controlling the conductive characteristics to be contained in the first layer region (C) 106 or the second layer region (G) 103 may be contained evenly within the whole of the first layer region (C) 106 or the second layer region (G) 103, or alternatively locally in a part of the first layer region (C) 106 or the second layer region layer (G) 103.

When the substance (D) for controlling the conductive characteristics is particularly incorporated locally in a part of the second layer region (G) in the present invention, the layer region (PN) containing the aforesaid substance (D) may desirably be provided as the end layer region of the second layer region (G). In particular, when the aforesaid layer region (PN) is provided as the end layer region on the support side of the second layer region (G), injection of charges of a specific polarity from the support into the light receiving layer can effectively be inhibited by selecting suitably the kind and the content of the aforesaid substance (D) to be contained in said layer region (PN).

In the photoconductive member of the present invention, the substance (D) capable of controlling the conductive characteristics may be incorporated in the second layer region (G) constituting a part of the light receiving layer either evenly throughout the whole region or locally in the direction of layer thickness. Further, alternatively, the aforesaid substance (D) may also be incorporated in the third layer region (S) disposed on the second layer region (G).

When the aforesaid substance (D) is to be incorporated in the third layer region (S), the kind and the content of the substance (D) to be incorporated in the third layer region (S) as well as its mode of incorporation may be determined suitably depending on the kind and the content of the substance (D) incorporated in the second layer region (G) as well as its mode of incorporation.

When the aforesaid substance (D) is to be incorporated in the third layer region (S), it is preferred that the aforesaid substance (D) should be incorporated within the layer region containing at least the contact interface with the second layer region (G).

The aforesaid substance (D) may be contained evenly throughout the whole layer region of the third layer region (S) or alternatively uniformly in a part of the layer region.

When the substance (D) for controlling the conductive characteristics is to be incorporated in both of the second layer region (G) and the third layer region (S), it is preferred that the layer region containing the aforesaid substance (D) in the second layer region (G) and the layer region containing the aforesaid substance (D) in the third layer region (S) may be contacted with each other.

Also, when the aforesaid substance (D) is contained in the first layer region (C), the second layer region (G) and the third layer region (S), said substance (D) may be either the same or different in the first layer region (C), the second layer region (G) and the third layer region (S), and their contents may also be the same or different in respective layer regions.

However, it is preferred that the content in the second layer region should be made sufficiently greater when the same kind of the aforesaid substance (D) is employed in respective three layer regions, or that different kinds of substance (D) with different electrical characteristics should be incorporated in desired respective layer regions.

In the present invention, by incorporating the substance (D) for controlling the conductive characteristics in at least the second layer region (G) constituting the light receiving layer, the conductive characteristics of the layer region containing said substance (D) [either a part or whole of the second layer region (G)] can freely be controlled as desired. As such a substance (D), there may be mentioned so called impurities in the field of semiconductors. In the present invention, there may be included p-type impurities giving p-type conductive characteristics and n-type impurities giving n-type conductive characteristics to a-SiGe(H,X).

More specifically, there may be mentioned as p-type impurities atoms belonging to the group III of the periodic table (Group III atoms), such as B (boron), Al (aluminum), Ga (gallium), In (indium), Tl (thallium), etc., particularly preferably B and Ga.

As n-type impurities, there may be included the atoms belonging to the group V of the periodic table, such as P (phosphorus), As (arsenic), Sb (antimony), Bi (bismuth), etc., particularly preferably P and As.

In the present invention, the content of the substance for controlling the conductive characteristics in the layer region (PN) may be suitably be selected depending on the conductive characteristics required for said layer region (PN), or when said layer region (PN) is provided in direct contact with the support, depending on the organic relation such as the relation with the characteristics at the contacted interface with the support.

The content of the substance for controlling the conductive characteristics may be suitably selected also in consideration of other layer regions provided in direct contact with said layer region (PN) and the relationship with the characteristics at the contacted interface with said other layer regions.

In the present invention, the content of the substance (D) for controlling the conductive characteristics in the layer region (PN) may be preferably 0.01 to $5 \times 10^4$ atomic ppm, more preferably 0.5 to $1 \times 10^4$ atomic ppm, most preferably 1 to $5 \times 10^3$ atomic ppm.

In the present invention, by making the content of the substance (D) for controlling the conductive characteristics in the layer region (PN) preferably 30 atomic ppm or more, more preferably 50 atomic ppm or more, most preferably 100 atomic ppm or more, in case, for example, when said substance (D) to be incorporated is a p-type impurity, at least injection of electrons from the support side through the second layer region (G) into the third layer region (S) layer can be effectively inhibited when the free surface of the light receiving layer is subjected to the charging treatment at ⊕ polarity, or in the case when the aforesaid substance (D) to be incorporated is an n-type impurity, at least injection of positive holes from the support side through the second layer region (G) into the third layer region (S) can be effectively inhibited when the free surface of the light-receiving layer is subjected to the charging treatment at ⊖ polarity.

In the above cases, as described previously, the layer region (Z) excluding the aforesaid layer region (PN) may contain a substance for controlling the conductive characteristics with a conduction type of a polarity different from that of the substance (D) for controlling the characteristics contained in the layer region (PN), or a substance for controlling the conductive characteristics with a conduction type of the same polarity in an amount by far smaller than the practical amount to be contained in the layer region (PN).

In such a case, the content of the substance for controlling the conductive characteristics to be contained in the aforesaid layer region (Z), which may suitably be determined as desired depending on the polarity and the content of the aforesaid substance contained in the aforesaid substance, may be preferably 0.001 to 1000 atomic ppm, more preferably 0.05 to 500 atomic ppm, most preferably 0.1 to 200 atomic ppm.

In the present invention, when the same kind of the substance (D) for controlling the conductive characteristics is contained in the layer region (PN) and the layer region (Z), the content in the layer region (Z) may preferably be 30 atomic ppm or less.

In the present invention, by providing in the light receiving layer a layer region containing a substance for controlling the conductive characteristics having a conduction type of one polarity and a layer region containing a substance for controlling the conductive characteristics having a conduction type of the other polarity in direct contact with each other, there can also be provided a so called depletion layer at said contacted region.

In short, for example, a depletion layer can be provided in the amorphous layer by providing a layer region containing the aforesaid p-type impurity and a layer region containing the aforesaid n-type impurity so as to be directly contacted with each other thereby to form a so called p-n junction.

In the present invention, formation of the first layer region (C) constituted of μc-Ge(Si,H,X) may be conducted according to a vacuum deposition method or a vapor deposition method utilizing discharging phenomenon, such as glow discharge method, sputtering method or ion-plating method. For example, for formation of the first layer region (C) constituted of μc-Ge(Si,H,X) according to the glow discharge method, the basic procedure comprises introducing a starting gas for Ge supply capable of supplying germanium atoms (Ge) optionally together with a starting gas for Si capable of supplying silicon atoms (Si) and a starting gas for introduction of hydrogen atoms (H) and/or halogen atoms (X) into the deposition chamber which can be internally brought to a reduced pressure, and forming a plasma atmosphere of these gases by exciting glow discharge in said deposition chamber, thereby forming a layer consisting of μc-Ge(Si,H,X) on the surface of a support set at a predetermined position. Alternatively, for formation according to the sputtering method, a starting gas for supplying Ge which may be diluted with a diluting gas such as He, Ar, etc. optionally together with a gas for introduction of hydrogen atoms (H) and/or halogen atoms (X) may be introduced into the deposition chamber for sputtering when sputtering one sheet of target constituted of Ge or two sheets of target of a constituted of Si and constituted of Ge, or a target of a mixture of Si and Ge in an atmosphere of an inert gas such as Ar, He or a gas mixture based on these gases.

In the case of the ion plating method, the layer can be formed in the same manner as in the case of sputtering except that, for example, a polycrystalline silicon or a single crystalline silicon and a polycrystalline germanium or a single crystalline germanium are each placed in a vapor deposition boat as the vaporizing source, and the vaporizing source is heated by the resistance heating method or the electron beam method (EB method) to be vaporized thereby permitting the flying vaporized product to pass through a desired gas plasma atmosphere.

For the purpose of crystallizing at least a part of the layer, it is necessary to raise the support temperature higher by 50° C. to 200° C. than the support temperature during preparation of the second layer region (G).

Formation of the second layer region (G) constituted of a-SiGe(H,X) may be conducted according to the vacuum deposition method utilizing discharging phenomenon, such as glow discharge method, sputtering method or ion-plating method. For example, for formation of the second layer region (G) constituted of a-SiGe(H,X) according to the glow discharge method, the basic procedure comprises introducing a starting gas for Si capable of supplying silicon atoms (Si) and a starting gas for Ge capable of supplying germanium atoms (Ge) optionally together with a starting gas for introduction of hydrogen atoms (H) and/or halogen atoms (X) into the deposition chamber which can be internally brought to a reduced pressure, and forming a plasma atmosphere of these gases by exciting glow discharge in said deposition chamber, thereby forming a layer consisting of a-Si(H,X) on the surface of a support set at a predetermined position. Alternatively, for formation according to the sputtering method, a starting gas for supplying Ge and Si which may be diluted with a diluting gas such as He, Ar, etc. optionally together with a gas for introduction of hydrogen atoms (H) and/or halogen atoms (X) may be introduced into the deposition chamber for sputtering when sputtering two sheets of target constituted of Si and constituted of Ge, or a target of a mixture of Si and Ge in an atmosphere of an inert gas such as Ar, He or a gas mixture based on these gases.

In the case of the ion plating method, the layer can be formed in the same manner as in the case of sputtering except that, for example, a polycrystalline silicon or a single crystalline silicon and a polycrystalline germanium or a single crystalline germanium are each placed in a vapor deposition boat as the vaporizing source, and the vaporizing source is heated by the resistance heating method or the electron beam method (EB method) to be vaporized thereby permitting the flying vaporized product to pass through a desired gas plasma atmosphere.

Formation of the third layer region (S) constituted of a-Si(H,X) may be performed following the same method and the conditions as in formation of the second layer region (G) by use of the starting materials (I) for forming the second layer region (G) as described above from which the starting gas for Ge is removed [starting materials (II) for formation of the third layer region (S)].

That is, in the present invention, formation of the third layer region (S) constituted of a-Si(H,X) may be conducted according to the vacuum deposition method utilizing discharging phenomenon, such as glow discharge method, sputtering method or ion-plating method. For example, for formation of the third layer region (S) constituted of a-Si(H,X) according to the glow discharge method, the basic procedure comprises introducing a starting gas for Si capable of supplying silicon atoms (Si) optionally together with a starting gas for introduction of hydrogen atoms (H) and/or halogen atoms (X) into the deposition chamber which can be internally brought to a reduced pressure, and forming a plasma atmosphere of these gases by exciting glow discharge in said deposition chamber, thereby forming a layer consisting of a-Si(H,X) on the surface of a support set at a predetermined position. Alternatively, for formation according to the sputtering method, a gas for introduction of hydrogen atoms (H) and/or halogen atoms (X) may be introduced into the deposition chamber for sputtering when sputtering a target constituted of Si in an atmosphere of an inert gas such as Ar, He or a gas mixture based on these gases.

In the present invention, no germanium atom is contained in the third layer region (S) provided on the second layer region (G), and by forming a light-receiving layer to such a structure, there can be obtained a photosensitive member which is excellent in photosensitivity to the light with wavelengths over all the region from short wavelength to relatively longer wavelength.

Also, since the germanium atoms are distributed in the first layer region (C) in such a state that the germanium atoms are continuously distributed throughout the entire layer region, when using a light source such as semiconductor laser, the light on the longer wavelength side which cannot substantially be absorbed by the third layer region (S) can be substantially completely absorbed in the first layer region (G), whereby the interference by reflection from the support surface can be prevented.

Also, in the photoconductive member of the present invention, since each of the materials constituting the second layer region (G) and the third layer region (S) contains common constituent elements of germanium atoms, chemical stability can sufficiently be ensured at the laminated interface.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the substance which can be a starting gas for supplying Ge, there may be included gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$ and the like. Particularly, from the standpoint of easiness in handling during layer forming working and good Ge supplying efficiency, $GeH_4$, $Ge_2H_6$ and $Ge_3H_8$ are preferred.

Effective starting gases for introduction of halogen atoms to be used in the present invention may include a large number of halogenic compounds, as examplified preferably by halogenic gases, halides, interhalogen compounds, or gaseous or gasifiable halogenic compounds such as silane derivatives substituted with halogens.

Further, there may also be included gaseous or gasifiable silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When forming the characteristic photoconductive member of the present invention by employment of a silicon compound containing halogen atoms according to the glow discharge method, without using a hydrogenated silicon gas as the starging material capable of supplying Si together with the starting material for supplying Ge, the first layer region (C) and the second layer region (G) can be formed on a desired support.

In the case of preparing the first layer region (C) and the second layer region (G) containing halogen atoms, the basic procedure comprises introducing, for example, a halogenated silicon as the starting gas for supplying Si and a hydrogenated germanium as the starting gas for supplying Ge mixed with a gas such as Ar, $H_2$, He, etc. at a desired ratio a flow rate into the deposition chamber for forming the first layer region (C) and the second layer region (G) and exciting glow discharge therein to form a plasma atmosphere of these gases, thereby forming the first layer region (C) and the second layer region (G) on the desired support. In order to control the ratio of hydrogen atoms introduced more easily, hydrogen gas or a gas of a silicon compound containing hydrogen atom may also be mixed at a desired amount in the starting gas for layer formation.

The respective gases may be used not only as a single species but also as a mixture of plural species at predetermined mixing ratios.

For formation of the first layer region (C) comprising μc-Ge(Si,H,X) and the second layer region (G) comprising a-SiGe(H,X) according to the reactive sputtering method or the ion plating method, for example, in the case of the sputtering method, one sheet of a target comprising Ge or two sheets of targets comprising Si and Ge, respectively, or a target comprising Si and Ge may be used and subjected to sputtering in a desired gas plasma atmosphere. In the case of the ion plating method, for example, a polycrystalline silicon or a single crystalline silicon and a polycrystalline germanium or a single crystalline germanium are placed in vapor deposition boats as evaporating sources, respectively, and the evaporating sources are heated by resistance heating method or electron beam method (EB method), thereby permitting the flying vaporized products to pass through a desired gas plasma atmosphere.

For incorporation of halogen atoms in the layer formed in the case of either the sputtering method or the ion plating method, a halogenic compound as mentioned above or a silicon compound containing halogen atoms may be introduced into a deposition chamber, followed by formation of a plasma atmosphere of said gas.

For incorporation of hydrogen atoms, a starting gas for introduction of hydrogen atoms, for example, $H_2$ or a silane or/and a hydrogenated germanium, etc. may be introduced into the deposition chamber for sputtering, followed by formation of a plasma atmosphere of said gases.

In the present invention, as the starting gases effectively employed for introduction of halogen atoms, the halogen compounds or the halo-containing silicon compounds may be used as effective ones. Otherwise, there may also be employed gaseous or gasifiable substances, including halides containing hydrogen as one of the constituents, for example, hydrogen halides such as HF, HCl, HBr and HI, halo-substituted hydrogenated silicon such as $SiH_2F_2$, $SiH_2I_2$, $SiH_2Cl_2$, $SiHCl_3$, $SiH_2Br_2$, $SiHBr_3$, etc., and hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc., or germanium halides such as $GeF_4$, $GeCl_4$, $GeBr_4$, $GeI_4$, $GeF_2$, $GeCl_2$, $GeBr_2$, $GeI_2$, etc., as the effective starting materials for formation of the first layer region (C) and the second layer region (G).

Among these substances, halides containing a hydrogen atom or atoms can be used as a preferable starting material for introduction of halogen atoms, because hydrogen atoms very effective controlling electrical and photoelectric characteristics can be incorporated into the layers at the same time during formation of the first layer region (C) and the second layer region (G).

Hydrogen atoms can be introduced structurally into the first layer region (C) and the second layer region (G), otherwise as described above, also by permitting $H_2$ or a hydrogenated silicon such as $SiH_4$, $Si_2H_6$, $Si_3H_8$, $Si_4H_{10}$, etc. and germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$ and silicon or a silicon compound to coexist in the deposition chamber, and exciting discharging therein.

According to a preferred embodiment of the present invention, the amount of hydrogen atoms (H) or halogen atoms (X) or the sum (H+X) of hydrogen atoms (H) and halogen atoms (X) to be contained in the first layer region (C), when containing at least one of hydrogen atoms or halogen atoms, is desired to be in the range generally from 0.0001 to 40 atomic %, preferably from 0.005 to 30 atomic %, most preferably 0.01 to 25 atomic %.

For controlling the amount of hydrogen atoms (H) or/and halogen atoms (X) to be contained in the first layer region (C), for example, the support temperature, the amount of the starting material introduced into the deposition device system to be used for incorporation of hydrogen atoms (H) or halogen atoms (X), discharging power and others may be controlled.

According to a preferred embodiment of the present invention, the amount of hydrogen atoms (H) or halogen atoms (X) or the sum (H+X) of hydrogen atoms (H) and halogen atoms (X) to be contained in the second layer region (G) is desired to be in the range generally from 0.01 to 40 atomic %, preferably from 0.05 to 30 atomic %, most preferably 0.1 to 25 atomic %.

For controlling the amount of hydrogen atoms (H) or/and halogen atoms (X) to be contained in the second layer region (G), for example, the support temperature, the amount of the starting material introduced into the deposition device system to be used for incorporation of hydrogen atoms (H) or halogen atoms (X), discharging power and others may be controlled.

In the present invention, the amount of hydrogen atoms (H) or halogen atoms (X) or the sum (H+X) of hydrogen atoms (H) and halogen atoms (X) to be contained in the third layer region (S) is desired to be in the range generally from 1 to 40 atomic %, preferably from 5 to 30 atomic %, most preferably 5 to 25 atomic %.

The fourth layer region (M) in the present invention is constituted of an amorphous material comprising silicon atoms (Si), carbon atoms (C) and optionally hydrogen atoms (H) or/and halogen atoms (X) [hereinafter written as "a-$(Si_xC_{1-x})_y(H,X)_{1-y}$", where $0<x<1$, and $0<y<1$].

Formation of the fourth layer region (M) constituted of a-$(Si_xC_{1-x})_y(H,X)_{1-y}$ may be performed according to the glow discharge method, the sputtering method, the ion plating method, the electron beam method, etc. These preparation methods may be suitably selected depending on various factors such as the preparation conditions, the degree of the load for capital investment for installations, the production scale, the desirable characteristics required for the photoconductive member to be prepared, etc. For the advantages of relatively easy control of the preparation conditions for preparing photoconductive members having desired characteristics and easy introduction of silicon atoms and carbon atoms, optionally together with hydrogen atoms or halogen atoms, into the fourth layer region (M) to be prepared, there may preferably be employed the glow discharge method or the sputtering method.

Further, in the present invention, the fourth layer region (M) may be formed by using the glow discharge method and the sputtering method in combination in the same device system.

For formation of the fourth layer region (M) according to the glow discharge method, starting gases for formation of a-$(Si_xC_{1-x})_y(H,X)_{1-y}$, optionally mixed at a predetermined mixing ratio with diluting gas, may be introduced into a deposition chamber for vacuum deposition in which a support is placed, and the gas introduced is made into a gas plasma by excitation of glow discharging, thereby depositing a-$(Si_xC_{1-x})_y(H,X)_{1-y}$ on the third layer region (S) which has already been formed on the aforesaid substrate.

As the starting gases for formation of a-$(Si_xC_{1-x})_y(H,X)_{1-y}$ to be used in the present invention, it is possible to use most of gaseous substances or gasified gasifiable substances containing at least one of silicon atoms (Si), carbon atoms (C), hydrogen atoms (H) and halogen atoms (X) as constituent atoms.

In the case when a starting gas having Si as constituent atoms as one of Si, C, H and X is employed, there may be employed, for example, a mixture of a starting gas containing Si as constituent atom, a starting gas containing C as constituent atoms, and optionally a starting gas containing H as constituent atom and/or a starting gas containing X as constituent atom, if desired, at a desired mixing ratio, or alternatively a mixture of a starting gas containing Si as constituent atoms with a starting gas containing C and H as constituent atoms also at a desired mixing ratio, or a mixture of a starting gas containing Si as constituent atom with a gas containing three kind of atoms of Si, C and H or of Si, C and X as constituent atoms at a desired mixing ratio.

Alternatively, it is also possible to use a mixture of a starting gas containing Si and H as constituent atoms with a starting gas containing C as constituent atom, or a mixture of a starting gas containing Si and X as the constituent atoms with a starting gas containing C as constituent atom.

In the present invention, preferable halogen atoms (X) to be contained in the fourth layer region (M) are F, Cl, Br and I, particularly preferably F and Cl.

In the present invention, the compounds which can be effectively used as starting gases for formation of the fourth layer region (M) may include substances which are gaseous or can be readily gasified under normal temperature and normal pressure.

In the present invention, the compound which can be effectively used as the starting gases for formation of the fourth layer region (M) may include hydrogenated silicon gases containing Si and H as constituent atoms such as silanes (e.g. $SiH_4$, $Si_2H_6$, $Si_3H_8$, $Si_4H_{10}$, etc.); compounds containing C and H as constituent atoms such as saturated hydrocarbons having 1 to 4 carbon atoms, ethylenic hydrocarbons having 2 to 4 carbon atoms and acetylenic hydrocarbons having 2 to 4 carbon atoms; single halogen substances; hydrogen halides; interhalogen compounds; silicon halides; halo-substituted hydrogenated silicon; and hydrogenated silicon. More specifically, there may be included, as saturated hydrocarbons, methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as acetylenic hydrocarbons, acetylene ($C_2H_2$), methyl acetylene($C_3H_4$), butyne ($C_4H_6$); as single halogen substances, halogenic gases such as of fluorine, chlorine, bromine and iodine; as hydrogen halides, HF, HI, HCl, HBr; as interhalogen compounds, BrF, ClF, $ClF_3$, $ClF_5$, $BrF_5$, $BrF_3$, $IF_7$, $IF_5$, ICl, IBr; as silicon halides, $SiF_4$, $Si_2F_6$, $SiCl_4$, $SiCl_3Br$, $SiCl_2Br_2$, $SiClBr_3$, $SiCl_3I$, $SiBr_4$, as halo-substituted hydrogenated silicon, $SiH_2F_2$, $SiH_2Cl_2$, $SiHCl_3$, $SiH_3Cl$, $SiH_2Br_2$, $SiHBr_3$, etc.; as hydrogenated silicon, silanes such as $SiH_4$, $Si_2H_6$, $Si_3H_8$, $Si_4H_{10}$, etc.; and so on.

In addition to these materials, there may also be employed halo-substituted paraffinic hydrocarbons such as $CF_4$, $CCl_4$, $CBr_4$, $CHF_3$, $CH_2F_2$, $CH_3F$, $CH_3Cl$, $CH_3Br$, $CH_3I$, $C_2H_5Cl$ and the like, fluorinated sulfur compounds such as $SF_4$, $SF_6$ and the like; alkyl silanes such as $Si(CH_3)_4$, $Si(C_2H_5)_4$, etc.; halo-containing alkyl silanes such as $SiCl(CH_3)_3$, $SiCl_2(CH_3)_2$, $SiCl_3CH_3$ and the like, as effective materials.

These materials for forming the fourth layer region (M) may be selected and employed as desired during formation of the fourth layer region (M) so that silicon atoms, carbon atoms and optionally halogen atoms and/or hydrogen atoms may be contained at a desired composition ratio in the fourth layer region (M) to be formed.

For example, $Si(CH_3)_4$ capable of incorporating easily silicon atoms, carbon atoms and hydrogen atoms and forming a layer with desired characteristics together with a material for incorporation of halogen atoms such as $SiHCl_3$, $SiH_2Cl_2$, $SiCl_4$ or $SiH_3Cl$, may be introduced at a certain mixing ratio under gaseous state into a device for formation of the fourth layer region (M), wherein glow discharging is excited thereby to form the fourth layer region (M) comprising a-$(Si_xC_{1-x})_y(Cl+H)_{1-y}$.

For formation of the fourth layer region (M) according to the sputtering method, a single crystalline or polycrystalline Si wafer and/or C wafer or a wafer containing Si and C mixed therein is used as target and subjected to sputtering in an atmosphere of various gases containing, if desired, halogen atoms or/and hydrogen atoms as constituent atoms.

For example, when Si wafer is used as an target, a starting gas for introducing C and H or/and X, which may be diluted with a diluting gas, if desired, is introduced into a deposition chamber for sputter to form a gas plasma therein and effect sputtering of said Si wafer.

Alternatively, Si and C as separate targets or one sheet target of a mixture of Si and C can be used and sputtering is effected in a gas atmosphere containing, if necessary, hydrogen atoms or/and halogen atoms As the starting gas for introduction of C, H and X, there may be employed the materials for formation of the fourth layer region (M) as mentioned in the glow discharge as described above as effective gases also in case of sputtering.

In the present invention, as the diluting gas to be used in forming the fourth layer region (M) by the glow discharge method or the sputtering method, there may preferably employed so called rare gases such as He, Ne, Ar and the like.

The fourth layer region (M) should be carefully formed so that the required characteristics may be given exactly as desired.

More specifically, a substance containing as constituent atoms Si, C and, if necessary, H or/and X can take various forms from crystalline to amorphous, electrical properties from conductive through semi-conductive to insulating and photoconductive properties from photoconductive to non-photoconductive depending on the preparation conditions. Therefore, in the present invention, the preparation conditions are strictly selected as desired so that there may be formed a-$(Si_xC_{1-x})_y(H,X)_{1-y}$ having desired characteristics depending on the purpose. For example, when the fourth layer region (M) is to be provided primarily for the purpose of improvement of dielectric strength, a-$(Si_xC_{1-x})_y(H,X)_{1-y}$ is prepared as an amorphous material having marked electric insulating behavior under the usage conditions.

Alternatively, when the primary purpose for provision of the fourth layer region (M) is improvement of continuous repeated use characteristics or environmental use characteristics, the degree of the above electric insulating property may be alleviated to some extent and a-$(Si_xC_{1-x})_y(H,X)_{1-y}$ may be prepared as an amorphous material having sensitivity to some extent to the light irradiated.

In forming the fourth layer region (M) comprising a-$(Si_xC_{1-x})_y(H,X)_{1-y}$ on the surface of the third layer region (S), the support temperature during layer formation is an important factor having influences on the structure and the characteristics of the layer to be formed, and it is desired in the present invention to control severely the support temperature during layer formation so that a-$(Si_xC_{1-x})_y(H,X)_{1-y}$ having intended characteristics may be prepared as desired.

For accomplishing effectively the objects in the present invention, there may be selected suitably the optimum temperature range in conformity with the method for forming the fourth layer region (M) in carrying out formation of the fourth layer region (M). Preferably, however, the support temperature may be 20° to 400° C., more preferably 50° to 350° C., most preferably 100° to 300° C. For formation of the fourth layer region (M), the glow discharge method or the sputtering method may be advantageously adopted, because severe control of the composition ratio of atoms constituting the layer or control of layer thickness can be conducted with relative ease as compared with other methods. In the case when the fourth layer region (M) is to be formed according to these layer forming methods, the discharging power during layer formation is one of important factors influencing the characteristics of a-$(Si_xC_{1-x})_y(H,X)_{1-y}$ to be prepared, similarly as the aforesaid support temperature.

The discharging power condition for preparing effectively a-$(Si_xC_{1-x})_y(H,X)_{1-y}$ having characteristics for accomplishing the objects of the present invention with good productivity may preferably be 10 to 300 W, more preferably 20 to 250 W, most preferably 50 to 200 W.

The gas pressure in the deposition chamber may preferably be 0.01 to 1 Torr, more preferably 0.1 to 0.5 Torr.

In the present invention, the above numerical ranges may be mentioned as preferable numerical ranges for the support temperature, discharging power, etc. for preparation of the fourth layer region (M). However, these factors for layer formation should not determined separately independently of each other, but it is desirable that the optimum values of respective layer forming factors should be determined based on mutual organic relationships so that the fourth layer region (M) comprising a-$(Si_xC_{1-x})_y(H,X)_{1-y}$ having desired characteristics may be formed.

The content of carbon atoms in the fourth layer region (M) in the photoconductive member of the present invention is the another important factor for obtaining the desired characteristics to accomplish the objects of the present invention, similarly as the conditions for preparation of the fourth layer region (M).

The content of carbon atoms in the fourth layer region (M) in the present invention should desirably be determined depending on the amorphous material constituting the fourth layer region and its characteristics.

More specifically, the amorphous material represented by the above formula a-$(Si_xC_{1-x})_y(H,X)_{1-y}$ may be classified broadly into an amorphous material constituted of silicon atoms and carbon atoms (hereinafter written as "a-$Si_aC_{1-a}$", where $0<a<1$), an amorphous material constituted of silicon atoms, carbon atoms and hydrogen atoms (hereinafter written as "a-$(Si_bC_{1-b})_cH_{1-c}$", where $0<b<1$, $0<c<1$) and an amorphous material constituted of silicon atoms, carbon atoms and halogen atoms and optionally hydrogen atoms (hereinafter written as "a-$(Si_cC_{1-c})_e(H,X)_{1-e}$", where $0<d<1$, $0<e<1$).

In the present invention, the content of carbon atoms contained in the fourth layer region (M), when it is constituted of a-$Si_aC_{1-a}$, may be preferably $1\times10^{-3}$ atomic %, more preferably 1 to 80 atomic %, most preferably 10 to 75 atomic %. That is, in terms of the aforesaid representation a in the formula a-$Si_aC_{1-a}$, a may be preferably 0.1 to 0.99999, more preferably 0.2 to 0.99, most preferably 0.25 to 0.9.

In the present invention, when the fourth layer region (M) is constituted of a-$(Si_bC_{1-b})_cH_{1-c}$, the content of carbon atoms contained in the fourth layer region (M) may be preferably $1\times10^{-3}$ to 90 atomic %, more preferably 1 to 90 atomic %, most preferably 10 to 80 atomic %. The content of hydrogen atoms may be preferably 1 to 40 atomic %, more preferably 2 to 35 atomic %, most preferably 5 to 30 atomic %. A photoconductive member formed to have a hydrogen atom content within these ranges is sufficiently applicable as an excellent one in practical applications.

That is, in terms of the representation by a-$(Si_bC_{1-b})_cH_{1-c}$, b may be preferably 0.1 to 0.99999, preferably 0.1 to 0.99, most preferably 0.15 to 0.9, and c preferably 0.6 to 0.99, preferably 0.65 to 0.98, most preferably 0.7 to 0.95.

When the fourth layer region (M) is constituted of a-$(Si_dC_{1-d})_e(H,X)_{1-e}$, the content of carbon atoms contained in the fourth layer region (M) may be preferably $1\times10^{-3}$ to 90 atomic %, more preferably 1 to 90 atomic %, most preferably 10 to 80 atomic %. The content of halogen atoms may be preferably 1 to 20 atomic %. A photoconductive member formed to have a halogen atom content with these ranges is sufficiently applicable as an excellent one in practical applications. The content of hydrogen atoms to be optionally contained may be preferably 19 atomic % or less, more preferably 13 atomic % or less.

That is, in terms of the representation by a-$(Si_dC_{1-d})_e(H,X)_{1-e}$, d may be preferably 0.1 to 0.99999, preferably 0.1 to 0.99, most preferably 0.15 to 0.9, and e preferably 0.8 to 0.99, more preferably 0.82 to 0.99, most preferably 0.85 to 0.98.

The range of the numerical value of layer thickness of the fourth layer region (M) is one of important factors for accomplishing effectively the objects of the present invention.

It should desirably be determined depending on the intended purpose so as to effectively accomplish the objects of the present invention.

The layer thickness of the fourth layer region (M) is required to be determined as desired suitably with due considerations about the relationships with the contents of carbon atoms, the layer thickness of the third layer region (S), as well as other organic relationships with the characteristics required for respective layers.

In addition, it is also desirable to have considerations from economical point of view such as productivity or capability of bulk production.

The fourth layer region (M) in the present invention is desired to have a layer thickness preferably of 0.003 to 30μ, more preferably 0.004 to 20μ, most preferably 0.005 to 10μ.

The support to be used in the present invention may be either electroconductive or insulating. As the electroconductive material, there may be mentioned metals such as NiCr, stainless steel, Al, Cr, Mo, Au, Nb, Ta, V, Ti, Pt, Pd etc. or alloys thereof.

As insulating supports, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. These insulating supports should preferably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be exhibited. However, in such a case, the thickness is preferably 10μ or more from the points of fabrication and handling of the support as well as its mechanical strength.

Figure 11:
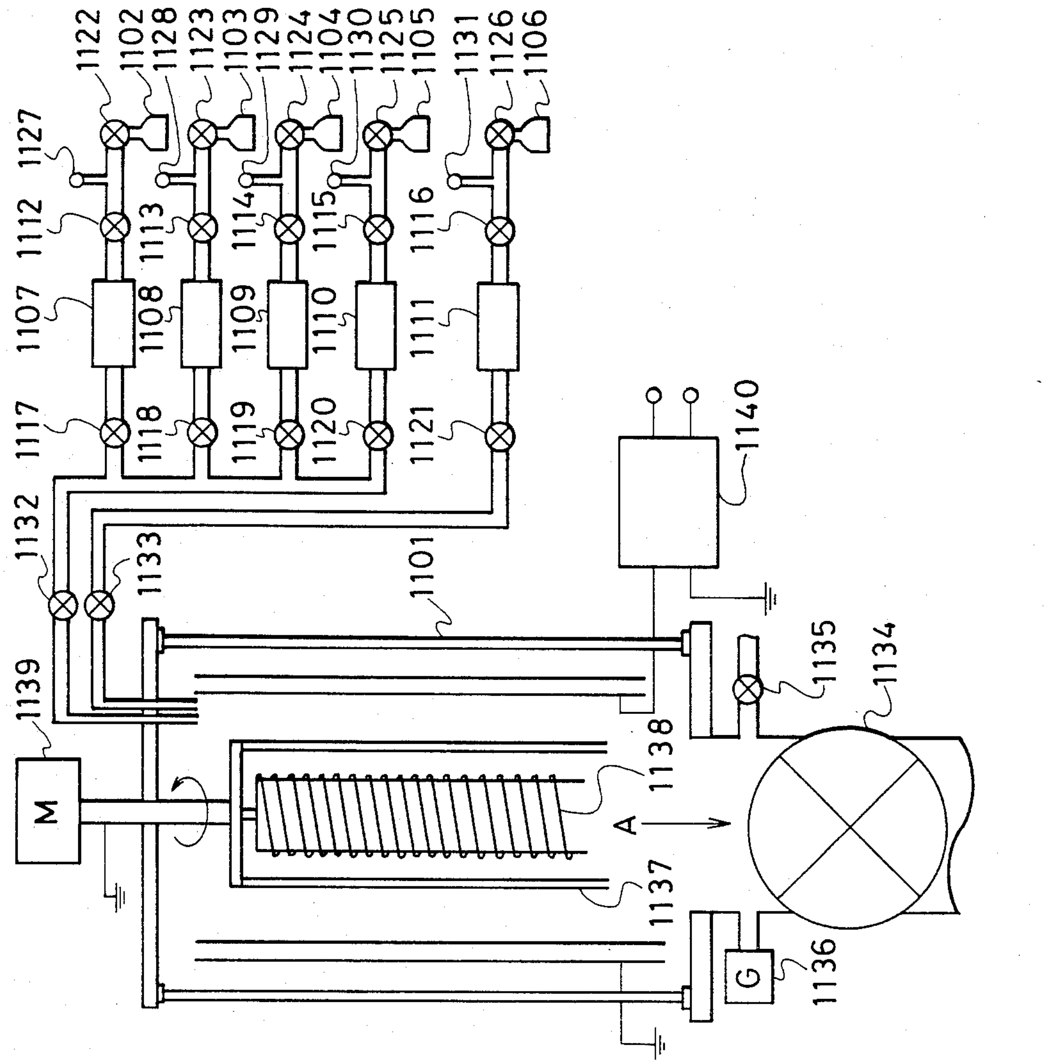
FIG. 11 shows a flow chart for illustration of the device used for preparation of the photoconductive members of the present invention.

FIG. 11 shows an example of the device for producing a photoconductive member.

In the gas bombs 1102–1106 in the Figure, there are hermetically contained starting gases for formation of the photoconductive member of the present invention. For example, 1102 is a bomb containing $SiH_4$ gas diluted with He (purity: 99.999%, hereinafter abbreviated as "$SiH_4$/He"), 1103 is a bomb containing $GeH_4$ gas diluted with He (purity: 99.999%, hereinafter abbreviated as "$GeH_4$/He"), 1104 is a bomb containing $SiF_4$ gas bomb diluted with He (purity: 99.99%, hereinafter abbreviated as $SiF_4$/He), 1105 is a He gas bomb (purity: 99.999%) and 1106 is a $H_2$ gas bomb (purity: 99.999%).

For allowing these gases to flow into the reaction chamber 1101, on confirmation of the valves 1122–1126 of the gas bombs 1102–1106 and the leak valve 1135 to be closed, and the inflow valves 1112–1116, the outflow valves 1117–1121 and the auxiliary valves 1132 and 1133 to be opened, the main valve 1134 is first opened to evacuate the reaction chamber 1101 and the gas pipelines. As the next step, when the reading on the vacuum indicator 1136 becomes $5\times10^{-6}$ Torr, the auxiliary valves 1132 and 1133 and the outflow valves 1117–1121 are closed.

Then, referring to one example of forming a first layer region (C) on the cylindrical substrate 1137, $SiH_4$/He gas from the gas bomb 1102, $GeH_4$/He gas from the gas bomb 1103 are permitted to flow into the mass-flow controllers 1107, 1108, respectively, by controlling the pressures at the outlet pressure gauges 1127, 1128 to 1 Kg/cm$^2$, respectively, by opening the valves 1122, 1123 and opening gradually inflow valves 1112, 1113. Subsequently, the outflow valves 1117, 1118 and the auxiliary valves 1132 are gradually opened to permit respective gases to flow into the reaction chamber 1101. The outflow valves 1117, 1118 are controlled so that the flow rate ratio of the respective gases may have a desired value and opening of the main valve 1134 is also controlled while watching the reading on the vacuum indicator 1136 so that the pressure in the reaction chamber may reach a desired value. And, after confirming that the temperature of the substrate 1137 is set at a temperature in the range of from about 400° to 600° C. by the heater 1138, the power source 1140 is set at a desired power to excite glow discharge in the reaction chamber 1101, while at the same time performing the operation to change gradually the opening of the valve 1118 manually or by means of an externally driven motor to change the flow rate of $GeH_4$/He gas according to the change ratio curve previously designed, whereby the depth profile of the germanium atoms contained in the layer formed are controlled.

As described above, glow discharging can be maintained for a desired period of time to form a first layer region (C) on the substrate 1137 to a desired thickness. At the stage, when the first layer region has been formed to a desired thickness, all the outflow valves are closed.

Referring next to one example of forming a second layer region (G) on the first layer region (C), $SiH_4$/He gas from the gas bomb 1102, $GeH_4$/He gas from the gas bomb 1103 are permitted to flow into the mass-flow controllers 1107, 1108, respectively, by controlling the pressures at the outlet pressure gauges 1127, 1128 to 1 Kg/cm$^2$, respectively, by opening the valves 1122, 1123 and opening gradually inflow valves 1112, 1113. Subsequently, the outflow valves 1117, 1118 and the auxiliary valves 1132 are gradually opened to permit respective gases to flow into the reaction chamber 1101. The outflow valves 1117, 1118 are controlled so that the flow rate ratio of the respective gases may have a desired value and opening of the main valve 1134 is also controlled while watching the reading on the vacuum indicator 1136 so that the pressure in the reaction chamber may reach a desired value. And, after confirming that the temperature of the substrate 1137 is set at a temperature in the range of from about 50° to 400° C. by the heater 1138, the power source 1140 is set at a desired power to excite glow discharge in the reaction chamber 1101, while at the same time performing the operation to change gradually the opening of the valve 1118 manually or by means of an externally driven motor to change the flow rate of $GeH_4$/He gas according to the change ratio curve previously designed, whereby the depth profile of the germanium atoms contained in the layer formed are controlled.

As described above, glow discharging can be maintained for a desired period of time to form a second layer region (G) on the first layer region (C) to a desired thickness. At the stage, when the second layer region (G) has been formed to a desired thickness, all the outflow valves are closed, and the discharging conditions are changed, if desired, following otherwise the same conditions and the same procedure, glow dischage can be maintained for a desired period of time, whereby a third layer region (S) containing substantially no germanium atom can be formed on the second layer region (G).

For incorporation of a substance controlling the conductivity in any desired layer region constituting the light receiving layer, a gas such as $B_2H_6$, $PH_3$, etc. may be added into the gas to be introduced into the deposition chamber 1101 during layer formation.

For formation of a fourth layer region (M) on the third layer region (S) formed to a desired thickness as described above, the gas line not used is changed to be used for $CH_4$ gas during deposition of the fourth layer region (M) and, according to the same valve operation as in formation of the third layer region (M), for example, diluting each of $SiH_4$ gas and $C_2H_4$ gas with He, if desired, and following the desired conditions, glow discharging may be excited thereby forming the fourth layer (M) on the third layer (S).

For incorporation of halogen atoms into the fourth layer region (M), for example, $SiF_4$ gas and $C_2H_4$ gas, optionally together with $SiH_4$, may be used and, following the same procedure as described above, the fourth layer region (M) can be formed with halogen atoms contained therein.

The outflow valves other than those for the gases necessary for formation of respective layers are of course all closed, and for avoiding remaining of gases used in the preceding layer in the reaction chamber 1101 and in the pipelines from the inflow valves 1117 to 1121 to the reaction chamber 1101, the operation to close and outflow valves 1117 to 1121, with opening of the auxiliary valves 1132, 1133 and full opening of the main valve 1132, thereby evacuating once the system to high vacuum, may be conducted if desired.

The content of the carbon atoms in the fourth layer region may be controlled by, for example, in the case of glow discharging, changing the flow rate ratio of $SiH_4$ gas to $C_2H_4$ gas to be introduced into the reaction chamber 1101, or in the case of sputtering by changing the area ratio of silicon wafer to graphite wafer when forming the target, or changing the mixing ratio of the silicon powder to the graphite powder before molding into a target as desired. The content of the halogen atoms (X) in the fourth layer region (M) can be controlled by controlling the flow rate of the starting gas for introduction of halogen atoms, for example, $SiF_4$ gas, when introduced into the reaction chamber 1101.

It is also desirable to set the substrate 1137 on rotation at a constant speed during layer formation in order to uniformize layer formation.

The present invention is further illustrated by referring to the following Examples.

EXAMPLE 1

By means of the device shown in FIG. 11, an image forming member for electrophotography was prepared by carrying out layer formations on a cylindrical aluminum substrate under the conditions shown in Table 1.

The image forming member thus obtained was set in a charging-exposure testing device and subjected to corona charging at ⊖5.0 KV for 0.3 sec., followed immediately by irradiation of a light image. The light image was irradiated by means of a tungsten lamp light source at a dose of 2 lux·sec through a transmission type test chart.

Immediately thereafter, ⊕ chargeable developer (containing toner and carrier) was cascaded on the surface of the image forming member to give a good toner image of the surface of the image forming member. When the toner image was transferred onto a transfer paper by corona charging of ⊖5.0 KV, a clear image of high density with excellent resolution and good gradation reproducibility was obtained.

EXAMPLE 2

By means of the device shown in FIG. 11, layer formations were conducted in the same manner as in Example 1 except for changing the conditions to those shown in Table 2 to prepare an image forming member for electrophotography.

For the image forming member thus obtained, an image was formed on a transfer paper under the same conditions and according to the same procedure as in Example 1 except for reversing the charged polarity and the charging polarity of the developer, respectively, whereby a very clear image quality could be obtained.

EXAMPLE 3

By means of the device shown in FIG. 11, layer formations were conducted in the same manner as in Example 1 except for changing the conditions to those shown in Table 3 to prepare an image forming member for electrophotography.

For the image forming member thus obtained, an image was formed on a transfer paper under the same conditions and according to the same procedure as in Example 1, whereby a very clear image quality could be obtained.

EXAMPLE 4

Example 1 was repeated except that the contents of germanium atoms contained in the first layer were varied by varying the gas flow rate ratio of $GeH_4$/He gas to $SiH_4$/He gas as shown in Table 4 to prepare image forming members for electrophotography, respectively.

For the image forming members thus obtained, images were formed on transfer papers under the same conditions and according to the same procedure as in Example 1 to obtain the results as shown in Table 4.

EXAMPLE 5

Example 1 was repeated except for changing the layer thickness of the first layer as shown in Table 5 to prepare respective image forming members for electrophotography.

For the image forming members thus obtained, images were formed on transfer papers under the same conditions and according to the same procedure as in Example 1 to obtain the results as shown in Table 5.

EXAMPLE 6

By means of the device shown in FIG. 11, an image forming member for electrophotography was prepared by carrying out layer formations on a cylindrical aluminum substrate under the conditions shown in Table 6.

The image forming member thus obtained was set in a charging-exposure testing device and subjected to corona charging at ⊖5.0 KV for 0.3 sec., followed immediately by irradiation of a light image. The light image was irradiated by means of a tungsten lamp light source at a dose of 2 lux·sec through a transmission type test chart.

Immediately thereafter, ⊕ chargeable developer (containing toner and carrier) was cascaded on the surface of the image forming member to give a good toner image of the surface of the image forming member. When the toner image was transferred onto a transfer paper by corona charging of ⊖5.0 KV, a clear image of high density with excellent resolution and good gradation reproducibility was obtained.

EXAMPLE 7

The image forming member for electrophotography prepared under the same conditions as in Example 1 was subjected to image formation under the same image forming conditions except for using a GaAs type semiconductor laser (10 mW) of 810 nm in place of the tungsten lamp as the light source, and image evaluation of the toner transfer image was conducted. As a result, a clear image of high quality could be obtained which was excellent in resolution and good in gradation reproducibility.

EXAMPLE 8

Image forming members for electrophotography were prepared following the same conditions and the procedures as in Examples 1 to 6, except for changing the preparation conditions for the fourth layer region (M) as shown in Table 7, respectively (72 samples with Sample No. 12-201 to 12-208, 12-301 to 12-308, . . . 12-1001 to 12-1008).

Each of the thus prepared image forming members was individually set in a copying device and subjected to corona charging at ⊖5 KV for 0.2 sec., followed by irradiation of light image. As the light source, a tungsten lamp was employed and the dose was controlled to 1.0 lux·sec. The latent image was developed with a ⊕ chargeable developer (containing toner and carrier) and transferred onto a plain paper.

The transferred images were found to be very good. The toner remaining on the image forming member for electrophotography without transfer was cleaned by a rubber blade. When such steps were repeated for 100,000 times or more, no deterioration of image could be seen in every case.

The overall evaluations of the respective transferred images and evaluation of durability after repeated successive copying are shown in Table 8.

EXAMPLE 9

Various image forming members were prepared according to the same method as in Example 1, respectively, except for varying the content ratio of silicon atoms to carbon atoms in the fourth layer region (M) by varying the target area ratio of silicon wafer to graphite during formation of the fourth layer region (M). For each of the image forming members thus obtained, the steps of image formation, developing and cleaning as in Example 1 were repeated for about 50,000 times, and thereafter image evaluations were conducted to obtain the results as shown in Table 9.

EXAMPLE 10

Various image forming members were prepared according to the same method as in Example 1, respectively, except for varying the content ratio of silicon atoms to carbon atoms in the fourth layer region (M) by varying the flow rate ratio of $SiH_4$ gas to $C_2H_4$ gas during formation of the fourth layer region (M). For each of the image forming members thus obtained, the steps up to transfer were repeated for about 50,000 times according to the methods as described in Example 1, and thereafter image evaluations were conducted to obtain the results as shown in Table 10.

EXAMPLE 11

Various image forming members were prepared according to the same method as in Example 1, respectively, except for varying the content ratio of silicon atoms to carbon atoms in the fourth layer region (M) by varying the flow rate ratio of $SiH_4$ gas, $SiF_4$ gas and $C_2H_4$ gas during formation of the fourth layer region (M). For each of the image forming members thus obtained, the steps of image formation, developing and cleaning as described in Example 1 were repeated for about 50,000 times, and thereafter image evaluations were conducted to obtain the results as shown in Table 11.

EXAMPLE 12

Respective image forming members were repeated in the same manner as in Example 1 except for changing the layer thickness of the fourth layer region (M), and the steps of image formation, developing and cleaning as described in Example 1 were repeated to obtain the results as shown in Table 12.

The common layer forming conditions in the above Examples 1 to 12 of the present invention are shown below:

Discharging frequency: 13.56 MHz

Inner pressure in reaction chamber during reaction: 0.3 Torr

EXAMPLE 13

Figure 12:
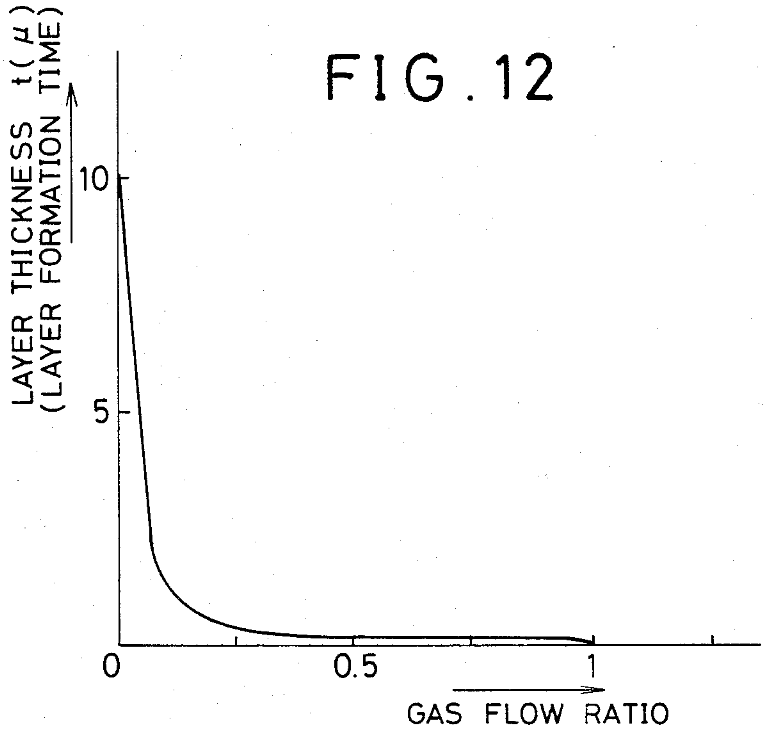
FIGS. 12 through 18 show graphs for illustration of the change of the gas flow rate ratios in Examples of the present invention, respectively.

By means of the device shown in FIG. 11, an image forming member for electrophotography was prepared by carrying out layer formations on a cylindrical aluminum substrate under the conditions shown in Table 13, while varying the gas flow rate ratio of $GeH_4$/He gas to $SiH_4$/He gas according to the change ratio curve shown in FIG. 12 with lapse of time for layer formation.

The image forming member thus obtained was set in a charging-exposure testing device and subjected to corona charging at ⊖5.0 KV for 0.3 sec., followed immediately by irradiation of a light image. The light image was irradiated by means of a tungsten lamp light source at a dose of 2 lux·sec through a transmission type test chart.

Immediately thereafter, ⊕ chargeable developer (containing toner and carrier) was cascaded on the surface of the image forming member to give a good toner image of the surface of the image forming member. When the toner image was transferred onto a transfer paper by corona charging of ⊖5.0 KV, a clear image of high density with excellent resolution and good gradation reproducibility was obtained.

EXAMPLE 14

Figure 13:
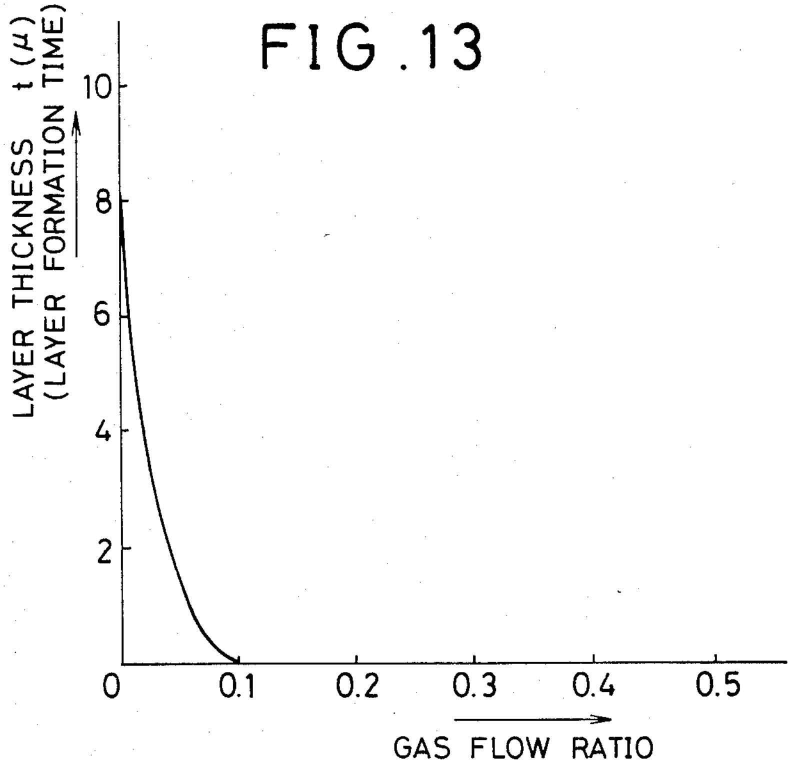

By means of the device shown in FIG. 11, an image forming member for electrophotography was prepared by carrying out layer formations under the conditions shown in Table 14, while varying the gas flow rate ratio of $GeH_4$/He gas to $SiH_4$/He gas according to the change ratio curve shown in FIG. 13 with lapse of time for layer formation, following otherwise the same conditions as in Example 13.

For the image forming member thus obtained, an image was formed or a transfer paper under the same conditions and according to the same procedure as in Example 13, whereby a very clear image quality could be obtained.

EXAMPLE 15

Figure 14:
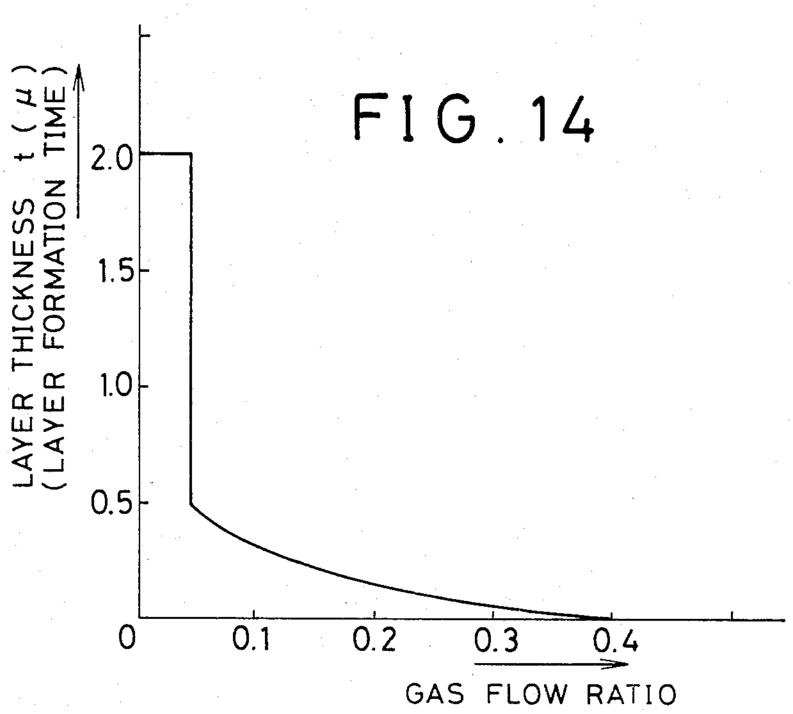

By means of the device shown in FIG. 11, an image forming member for electrophotography was prepared by carrying out layer formations under the conditions shown in Table 15, while varying the gas flow rate ratio of $GeH_4$/He gas to $SiH_4$/He gas according to the change ratio curve shown in FIG. 14 with lapse of time for layer formation, following otherwise the same conditions as in Example 13.

For the image forming member thus obtained, an image was formed on a transfer paper under the same conditions and according to the same procedure as in Example 13, whereby a very clear image quality could be obtained.

EXAMPLE 16

Figure 15:
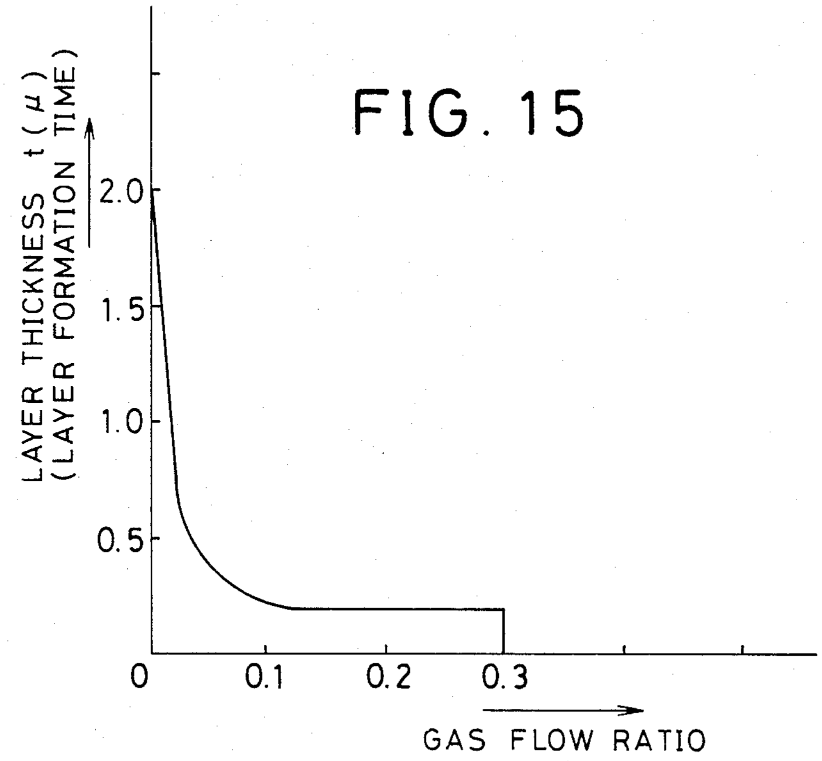

By means of the device shown in FIG. 11, an image forming member for electrophotography was prepared by carrying out layer formations under the conditions shown in Table 16, while varying the gas flow rate ratio of $GeH_4$/He gas to $SiH_4$/He gas according to the change ratio curve shown in FIG. 15 with lapse of time for layer formation, following otherwise the same conditions as in Example 13.

For the image forming member thus obtained, an image was formed on a transfer paper under the same conditions and according to the same procedure as in Example 13, whereby a very clear image quality could be obtained.

EXAMPLE 17

Figure 16:
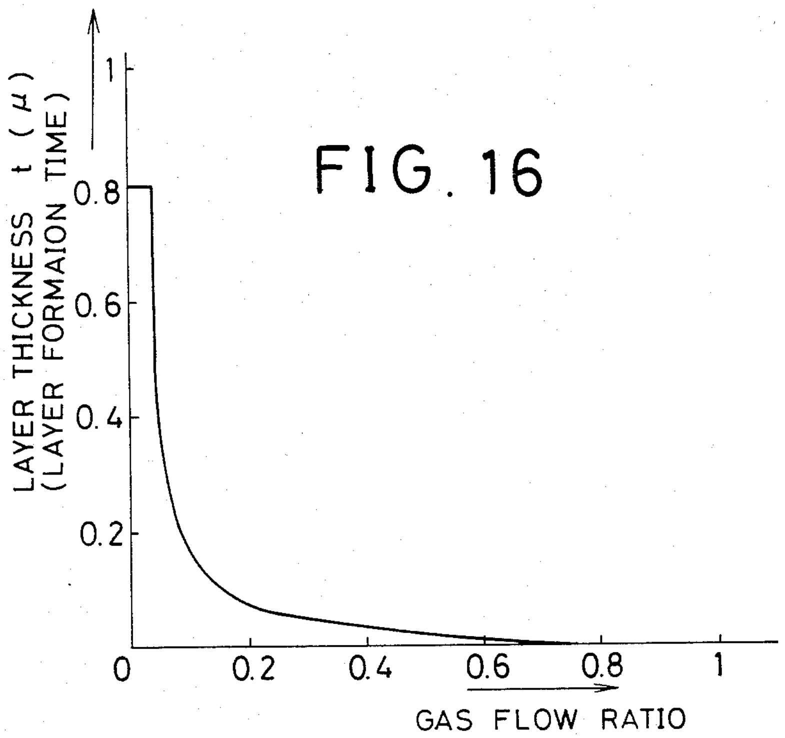

By means of the device shown in FIG. 11, an image forming member for electrophotography was prepared by carrying out layer formations under the conditions shown in Table 17, while varying the gas flow rate ratio of $GeH_4$/He gas to $SiH_4$/He gas according to the change ratio curve shown in FIG. 16 with lapse of time for layer formation, following otherwise the same conditions as in Example 13.

For the image forming member thus obtained, an image was formed on a transfer paper under the same conditions and according to the same procedure as in Example 13, whereby a very clear image quality could be obtained.

EXAMPLE 18

Figure 17:
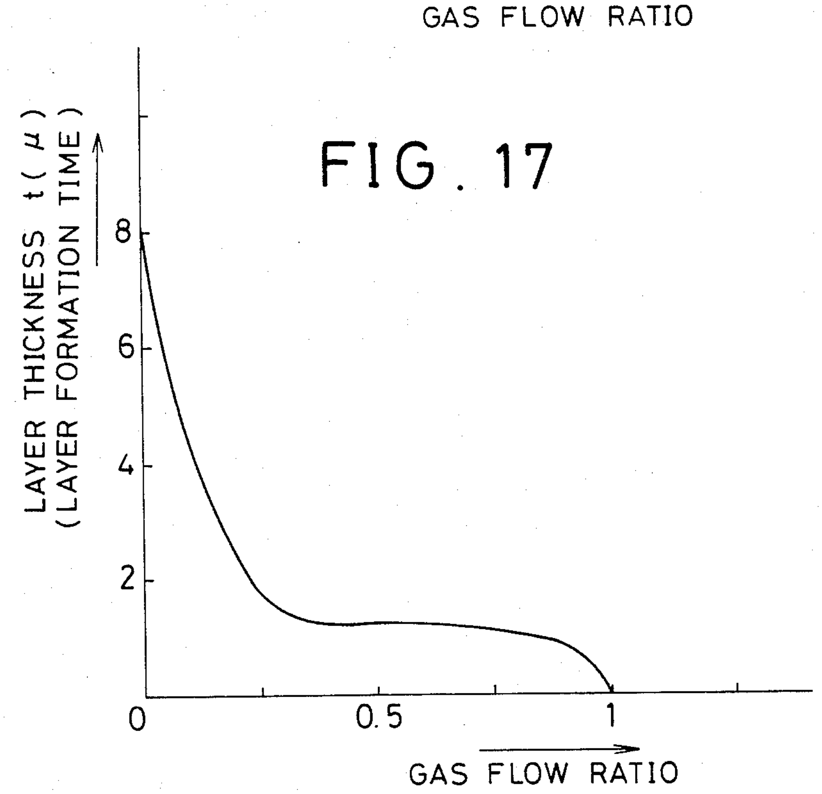

By means of the device shown in FIG. 11, an image forming member for electrophotography was prepared by carrying out layer formations under the conditions shown in Table 18, while varying the gas flow rate ratio of $GeH_4$/He gas to $SiH_4$/He gas according to the change ratio curve shown in FIG. 17 with lapse of time for layer formation, following otherwise the same conditions as in Example 13.

For the image forming member thus obtained, an image was formed on a transfer paper under the same conditions and according to the same procedure as in Example 13, whereby a very clear image quality could be obtained.

EXAMPLE 19

Figure 18:
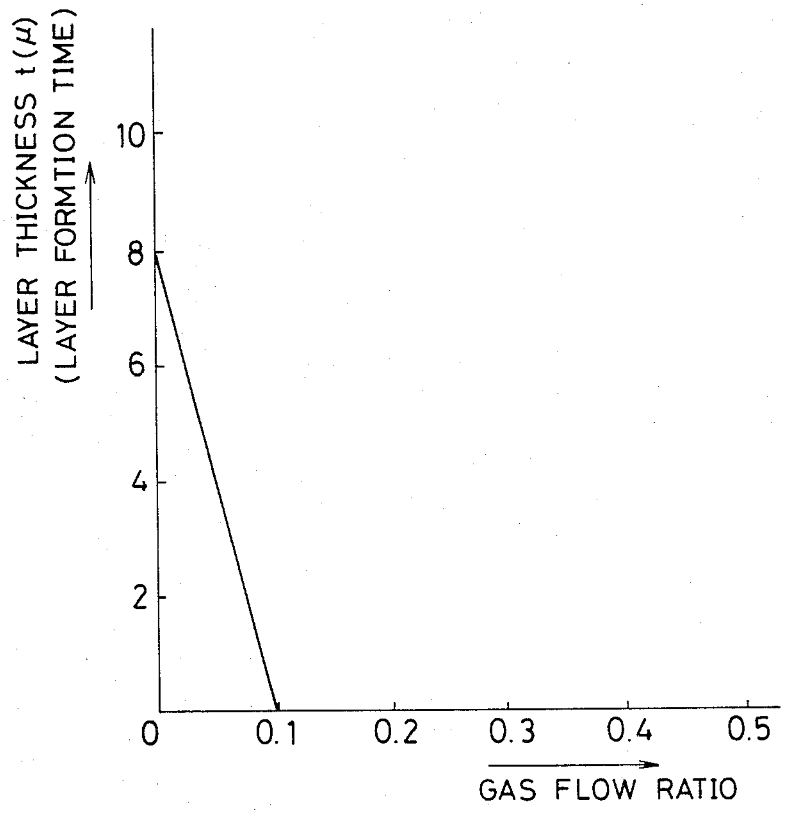

By means of the device shown in FIG. 11, an image forming member for electrophotography was prepared by carrying out layer formations under the conditions shown in Table 19, while varying the gas flow rate ratio of $GeH_4$/He gas to $SiH_4$/He gas according to the change ratio curve shown in FIG. 18 with lapse of time for layer formation, following otherwise the same conditions as in Example 13.

For the image forming member thus obtained, an image was formed on a transfer paper under the same conditions and according to the same procedure as in Example 13, whereby a very clear image quality could be obtained.

EXAMPLE 20

The procedure of Example 13 was repeated except for using $Si_2H_6$/He gas in place of $SiH_4$/He gas and changing the conditions to those shown in Table 20 to prepare an image forming member for electrophotography.

For the image forming member thus obtained, an image was formed on a transfer paper under the same conditions and according to the same procedure as in Example 13, whereby a very clear image quality could be obtained.

EXAMPLE 21

The procedure of Example 13 was repeated except for using $SiF_4$/He gas in place of $SiH_4$/He gas and changing the conditions to those shown in Table 21 to prepare an image forming member for electrophotography.

For the image forming member thus obtained, an image was formed on a transfer paper under the same conditions and according to the same procedure as in Example 13, whereby a very clear image quality could be obtained.

EXAMPLE 22

The procedure of Example 13 was repeated except for using ($SiH_4$/He gas+$SiF_4$/He gas) in place of $SiH_4$/He gas and changing the conditions to those shown in Table 22 to prepare an image forming member for electrophotography.

For the image forming member thus obtained, an image was formed on a transfer paper under the same conditions and according to the same procedure as in Example 13, whereby a very clear image quality could be obtained.

EXAMPLE 23

In Examples 13 to 22, the conditions for preparation of the third layer were changed to those as shown in Table 23, following otherwise the same conditions in the respective Examples to prepare respective image forming members for electrophotography.

For the image forming members thus obtained, images were formed on a transfer paper under the same conditions and according to the same procedure as in Example 13, whereby the results as shown in Table 23A were obtained.

EXAMPLE 24

In Examples 13 to 22, the conditions for preparation of the third layer were changed to those as shown in Table 24, following otherwise the same conditions in the respective Examples to prepare respective image forming members for electrophotography.

For the image forming members thus obtained, images were formed on a transfer paper under the same conditions and according to the same procedure as in Example 13, whereby the results as shown in Table 24A were obtained.

EXAMPLE 25

The image forming member for electrophotography prepared under the same conditions as in Example 13 was subjected to image formation under the same image forming conditions as in Example 13 except for using a GaAs type semiconductor laser (10 mW) of 810 nm in place of the tungsten lamp as the light source, and image evaluation of the toner transfer image was conducted. As a result, a clear image of high quality could be obtained which was excellent in resolution and good in gradation reproducibility.

EXAMPLE 26

Except for following the conditions for producing the fourth layer region (M) in Table 25, image forming members for electrophotography were prepared following the same conditions and the procedures as in Examples 14 to 22, except for changing the preparation conditions as shown in Table 25, respectively (72 samples with Sample No. 25-201 to 25-208, 25-301 to 25-308, . . . , 25-1001 to 25-1009).

Each of the thus prepared image forming members thus prepared was individually set in a copying device and subjected to corona charging at ⊖5 KV for 0.2 sec., followed by irradiation of light image. As the light source, a tungsten lamp was employed and the dose was controlled to 1.0 lux·sec. The latent image was developed with a ⊕ chargeable developer (containing toner and carrier) and transferred onto a plain paper.

The transferred images were found to be very good. The toner remaining on the image forming member for electrophotography without transfer was cleaned by a rubber blade. When such steps were repeated for 100,000 times or more, no deterioration of image could been seen in every case.

The overall evaluations of the respective transferred images and evaluation of durability after repeated successive copying are shown in Table 26.

EXAMPLE 27

Various image forming members were prepared according to the same method as in Example 13, respectively, except for varying the content ratio of silicon atoms to carbon atoms in the fourth layer region (M) by varying the target area ratio of silicon wafer to graphite during formation of the fourth layer region (M). For each of the image forming members thus obtained, the steps of image formation, developing and cleaning as in Example 13 were repeated for about 50,000 times, and thereafter image evaluations were conducted to obtain the results as shown in Table 27.

EXAMPLE 28

Various image forming members were prepared according to the same method as in Example 13, respectively, except for varying the content ratio of silicon atoms to carbon atoms in the fourth layer region (M) by varying the flow rate ratio of $SiH_4$ gas to $C_2H_4$ gas during formation of the fourth layer region (M). For each of the image forming members thus obtained, the steps up to transfer were repeated for about 50,000 times according to the methods as described in Example 13, and thereafter image evaluations were conducted to obtain the results as shown in Table 28.

EXAMPLE 29

Various image forming members were prepared according to the same method as in Example 13, respectively, except for varying the content ratio of silicon atoms to carbon atoms in the fourth layer region (M) by varying the flow rate ratio of $SiH_4$ gas, $SiF_4$ gas and $C_2H_4$ gas during formation of the fourth layer region (M). For each of the image forming members thus obtained, the steps of image formation, developing and cleaning as described in Example 13 were repeated for about 50,000 times, and thereafter image evaluations were conducted to obtain the results as shown in Table 29.

EXAMPLE 30

Respective image forming members were repeated in the same manner as in Example 13 except for changing the layer thickness of the fourth layer region (M), and the steps of image formation, developing and cleaning as described in Example 13 were repeated to obtain the results as shown in Table 30.

The common layer forming conditions in the above Examples 13 to 30 of the present invention are shown below:

Discharging frequency: 13.56 MHz

Inner pressure in reaction chamber during reaction: 0.3 Torr

EXAMPLE 31

By means of the device shown in FIG. 11, an image forming member for electrophotography was prepared by carrying out layer formations on a cylindrical aluminum substrate under the conditions shown in Table 31.

The image forming member thus obtained was set in a charging-exposure testing device and subjected to corona charging at ⊕5.0 KV for 0.3 sec., followed immediately by irradiation of a light image. The light image was irradiated by means of a tungsten lamp light source at a dose of 2 lux·sec through a transmission type test chart.

Immediately thereafter, ⊖ chargeable developer (containing toner and carrier) was cascaded on the surface of the image forming member to give a good toner image of the surface of the image forming member. When the toner image was transferred onto a transfer paper by corona charging of ⊕5.0 KV, a clear image of high density with excellent resolution and good gradation reproducibility was obtained.

EXAMPLE 32

By means of the device shown in FIG. 11, layer formations were conducted in the same manner as in Example 31 except for changing the conditions to those shown in Table 32 to prepare an image forming member for electrophotography.

For the image forming member thus obtained, an image was formed on a transfer paper under the same conditions and according to the same procedure as in Example 31 except for reversing the charging polarity and the chargeable polarity of the developer, respectively, whereby a very clear image quality could be obtained.

EXAMPLE 33

By means of the device shown in FIG. 11, layer formations were conducted in the same manner as in Example 31 except for changing the conditions to those shown in Table 33 to prepare an image forming member for electrophotography.

For the image forming member thus obtained, an image was formed on a transfer paper under the same conditions and according to the same procedure as in Example 31, whereby a very clear image quality could be obtained.

EXAMPLE 34

The procedure of Example 31 was repeated except that the contents of germanium atoms contained in the first layer were varied by varying the gas flow rage ratio of $GeH_4$/He gas to $SiH_4$/He gas as shown in Table 34 to prepare image forming members for electrophotography, respectively.

For the image forming members thus obtained, images were formed on transfer papers under the same conditions and according to the same procedure as in Example 31 to obtain the results as shown in Table 34.

EXAMPLE 35

The procedure of Example 31 was repeated except for changing the layer thickness of the first layer as shown in Table 35 to prepare respective image forming members for electrophotography.

For the image forming members thus obtained, images were formed on transfer papers under the same conditions and according to the same procedure as in Example 31 to obtain the results as shown in Table 35.

EXAMPLE 36

By means of the device shown in FIG. 11, an image forming member for electrophotography was prepared by carrying out layer formations on a cylindrical aluminum substrate under the conditions shown in Table 36.

The image forming member thus obtained was set in a charging-exposure testing device and subjected to corona charging at ⊕5.0 KV for 0.3 sec., followed immediately by irradiation of a light image. The light image was irradiated by means of a tungsten lamp light source at a dose of 2 lux·sec through a transmission type test chart.

Immediately thereafter, ⊖ chargeable developer (containing toner and carrier) was cascaded on the surface of the image forming member to give a good toner image of the surface of the image forming member. When the toner image was transferred onto a transfer paper by corona charging of ⊕5.0 KV, a clear image of high density with excellent resolution and good gradation reproducibility was obtained.

EXAMPLE 37

By means of the device shown in FIG. 11, an image forming member for electrophotography was prepared by carrying out layer formations on a cylindrical aluminum substrate under the conditions shown in Table 37.

The image forming member thus obtained was set in a charging-exposure testing device and subjected to corona charging at ⊖5.0 KV for 0.3 sec., followed immediately by irradiation of a light image. The light image was irradiated by means of a tungsten lamp light source at a dose of 2 lux·sec through a transmission type test chart.

Immediately thereafter, ⊕ chargeable developer (containing toner and carrier) was cascaded on the surface of the image forming member to give a good toner image of the surface of the image forming member. When the toner image was transferred onto a transfer paper by corona charging of ⊖5.0 KV, a clear image of high density with excellent resolution and good gradation reproducibility was obtained.

EXAMPLE 38

By means of the device shown in FIG. 11, an image forming member for electrophotography was prepared by carrying out layer formations on a cylindrical aluminum substrate under the conditions shown in Table 38.

The image forming member thus obtained was set in a charging-exposure testing device and subjected to corona charging at ⊖5.0 KV for 0.3 sec., followed immediately by irradiation of a light image. The light image was irradiated by means of a tungsten lamp light source at a dose of 2 lux·sec through a transmission type test chart.

Immediately thereafter, ⊕ chargeable developer (containing toner and carrier) was cascaded on the surface of the image forming member to give a good toner image of the surface of the image forming member. When the toner image was transferred onto a transfer paper by corona charging of ⊖5.0 KV, a clear image of high density with excellent resolution and good gradation reproducibility was obtained.

EXAMPLE 39

By means of the device shown in FIG. 11, an image forming member for electrophotography was prepared in the same manner as in Example 31, except for changing the conditions as shown in Table 39.

When image formation was conducted by use of the image forming member thus obtained under the same conditions and according to the same procedure as in Example 31, a very clear image quality could be obtained.

EXAMPLE 40

By means of the device shown in FIG. 11, an image forming member for electrophotography was prepared in the same manner as in Example 31, except for changing the conditions as shown in Table 40.

When image formation was conducted by use of the image forming member thus obtained under the same conditions and according to the same procedure as in Example 31 and the developed image was transferred onto a transfer paper, a very clear image quality could be obtained.

EXAMPLE 41

The image forming member for electrophotography prepared under the same conditions as in Example 31 was subjected to image formation under the same image forming conditions as in Example 31 except for using a GaAs type semiconductor laser (10 mW) of 810 nm in place of the tungsten lamp as the light source, and image evaluation of the toner transfer image was conducted. As a result, a clear image of high quality could be obtained which was excellent in resolution and good in gradation reproducibility.

EXAMPLE 42

Image forming members for electrophotography were prepared following the same conditions and the procedures as in Examples 31 to 39, except for changing the preparation conditions for the fourth layer region (M) as shown in Table 41, respectively (72 samples with sample No. 42-201 to 42-208, 42-301 to 42-308, . . . , 42-1001 to 42-1008).

Each of the image forming members thus prepared was individually set in a copying device and subjected to corona charging at ⊖5 KV for 0.2 sec., followed by irradiation of light image. As the light source, a tungsten lamp was employed and the dose was controlled to 1.0 lux sec. The latent image was developed with a ⊕ chargeable developer (containing toner and carrier) and transferred onto a plain paper.

The transferred images were found to be very good. The toner remaining on the image forming member for electrophotography without transfer was cleaned by a rubber blade. When such steps were repeated for 100,000 times or more, no deterioration of image could be seen in every case.

The overall evaluations of the respective transferred images and evaluation of durability after repeated successive copying are shown in Table 42.

EXAMPLE 43

Various image forming members were prepared according to the same method as in Example 31, respectively, except for varying the content ratio of silicon atoms to carbon atoms in the fourth layer region (M) by varying the target area ratio of silicon wafer to graphite during formation of the fourth layer region (M). For each of the image forming members thus obtained, the steps of image formation, developing and cleaning as in Example 31 were repeated for about 50,000 times, and thereafter image evaluations were conducted to obtain the results as shown in Table 43.

EXAMPLE 44

Various image forming members were prepared according to the same method as in Example 31, respectively, except for varying the content ratio of silicon atoms to carbon atoms in the fourth layer region (M) by varying the flow rate ratio of $SiH_4$ gas to $C_2H_4$ gas during formation of the fourth layer region (M). For each of the image forming members thus obtained, the steps up to transfer were repeated for about 50,000 times according to the methods as described in Example 31, and thereafter image evaluations were conducted to obtain the results as shown in Table 44.

EXAMPLE 45

Various image forming members were prepared according to the same method as in Example 31, respectively, except for varying the content ratio of silicon atoms to carbon atoms in the fourth layer region (M) by varying the flow rate ratio of $SiH_4$ gas, $SiF_4$ gas and $C_2H_4$ gas during formation of the fourth layer region (M). For each of the image forming members thus obtained, the steps of image formation, developing and cleaning as described in Example 31 were repeated for about 50,000 times, and thereafter image evaluations were conducted to obtain the results as shown in Table 45.

EXAMPLE 46

Respective image forming members were repeated in the same manner as in Example 31 except for changing the layer thickness of the fourth layer region (M), and the steps of image formation, developing and cleaning as described in Example 31 were repeated to obtain the results as shown in Table 46.

The common layer forming conditions in the above Examples 31 to 46 of the present invention are shown below:

Discharging frequency: 13.56 MHz

Inner pressure in reaction chamber during reaction: 0.3 Torr

TABLE 1

| Layer constitution | Gases employed | Flow rate (SCCM) | Flow rate ratio | Discharging power (W/cm$^2$) | Layer formation speed (Å/sec) | Layer thickness (μ) | Substrate temperature (°C.) |
|---|---|---|---|---|---|---|---|
| First layer | $GeH_4/He = 0.05$ | $GeH_4 = 10$ | | 0.2 | 3 | 0.1 | 450 |
| Second layer | $SiH_4/He = 0.05$<br>$GeH_4/He = 0.05$ | $SiH_4 + GeH_4 = 50$ | $GeH_4/SiH_4 = 1$ | 0.18 | 5 | 3 | 250 |
| Third layer | $SiH_4/He = 0.5$ | $SiH_4 = 200$ | | 0.18 | 15 | 15 | 250 |
| Fourth layer | $SiH_4/He = 0.5$<br>$C_2H_4$ | $SiH_4 = 100$ | $SiH_4/C_2H_4 = 3/7$ | 0.18 | 10 | 0.5 | 250 |

TABLE 2

| Layer constitution | Gases employed | Flow rate (SCCM) | Flow rate ratio | Discharging power (W/cm$^2$) | Layer formation speed (Å/sec) | Layer thickness (μ) | Substrate temperature (°C.) |
|---|---|---|---|---|---|---|---|
| First layer | $GeH_4/He = 0.05$ | $GeH_4 = 10$ | | 0.2 | 3 | 0.1 | 450 |
| Second layer | $SiH_4/He = 0.05$<br>$GeH_4/He = 0.05$ | $SiH_4 + GeH_4 = 50$ | $GeH_4/SiH_4 = 0.1$ | 0.18 | 5 | 20 | 250 |
| Third layer | $SiH_4/He = 0.5$ | $SiH_4 = 200$ | | 0.18 | 15 | 5 | 250 |
| Fourth layer | $SiH_4/He = 0.5$<br>$C_2H_4$ | $SiH_4 = 100$ | $SiH_4/C_2H_4 = 1/9$ | 0.18 | 10 | 0.5 | 250 |

TABLE 3

| Layer constitution | Gases employed | Flow rate (SCCM) | Fow rate ratio | Discharging power (W/cm$^2$) | Layer formation speed (Å/sec) | Layer thickness (μ) | Substrate temperature (°C.) |
|---|---|---|---|---|---|---|---|
| First layer | $SiH_4/He = 0.05$<br>$GeH_4/He = 0.05$ | $SiH_4 + GeH_4 = 10$ | $GeH_4/SiH_4 = 3$ | 0.2 | 3 | 0.2 | 450 |
| Second layer | $SiH_4/He = 0.05$<br>$GeH_4/He = 0.05$ | $SiH_4 + GeH_4 = 50$ | $GeH_4/SiH_4 = 0.4$ | 0.18 | 5 | 2 | 250 |
| Third layer | $SiH_4/He = 0.5$<br>$B_2H_6/He = 10^{-3}$ | $SiH_4 = 200$ | <br>$B_2H_6/SiH_4 = 2 \times 10^{-5}$ | 0.18 | 15 | 20 | 250 |
| Fourth layer | $SiH_4/He = 0.5$<br>$C_2H_4$ | $SiH_4 = 100$ | $SiH_4/C_2H_4 = 3/7$ | 0.18 | 10 | 0.5 | 250 |

TABLE 4

| Sample No. | 401 | 402 | 403 | 404 | 405 | 406 | 407 | 408 |
|---|---|---|---|---|---|---|---|---|
| Ge content (atomic %) | 1 | 3 | 5 | 10 | 40 | 60 | 90 | 100 |

TABLE 4-continued

| Sample No. | 401 | 402 | 403 | 404 | 405 | 406 | 407 | 408 |
|---|---|---|---|---|---|---|---|---|
| Evaluation | Δ | o | o | o | ◎ | ◎ | ◎ | ◎ |

◎: Excellent
o: Good
Δ: Practically satisfactory

TABLE 5

| Sample No. | 501 | 502 | 503 | 504 | 505 | 506 | 507 |
|---|---|---|---|---|---|---|---|
| Layer thickness (μ) | 0.01 | 0.05 | 0.1 | 0.5 | 1 | 2 | 5 |
| Evaluation | Δ | Δ | ◎ | ◎ | o | Δ | Δ |

◎: Excellent
o: Good
Δ: Practically satisfactory

TABLE 6

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| First layer | $GeH_4/He = 0.05$ | $GeH_4 = 10$ | | 0.2 | 3 | 0.1 | 500 |
| Second layer | $SiH_4/He = 0.05$<br>$GeH_4/He = 0.05$ | $SiH_4 + GeH_4 = 50$ | $GeH_4/SiH_4 = 1$ | 0.18 | 5 | 2 | 250 |
| Third layer | $SiH_4/He = 0.5$<br>$PH_3/He = 10^{-3}$ | $SiH_4 = 200$ | $PH_3/SiH_4 = 1/10^{-7}$ | 0.18 | 15 | 20 | 250 |
| Fourth layer | $SiH_4/He = 0.5$<br>$C_2H_4$ | $SiH_4 = 100$ | $SiH_4/C_2H_4 = 3/7$ | 0.18 | 10 | 0.5 | 250 |

TABLE 7

| Condition | gases employed | Flow rate (SCCM) | Flow rate ratio or area ratio | Discharging power ($W/cm^2$) | Layer thickness (μ) |
|---|---|---|---|---|---|
| 12-1 | Ar | 200 | Si wafer:graphite= :5:8.5 | 0.3 | 0.5 |
| 12-2 | Ar | 200 | Si wafer:graphite= 0.5:9.5 | 0.3 | 0.3 |
| 12-3 | Ar | 200 | Si wafer:graphite = 6:4 | 0.3 | 1.0 |
| 12-4 | $SiH_4/He = 1$<br>$C_2H_4$ | $SiH_4 = 15$ | $SiH_4:C_2H_4 = 0.4:9.6$ | 0.18 | 0.3 |
| 12-5 | $SiH_4/He = 0.5$<br>$C_2H_4$ | $SiH_4 = 100$ | $SiH_4:C_2H_4 = 5:5$ | 0.18 | 1.5 |
| 12-6 | $SiH_4/He = 0.5$<br>$SiF_4/He = 0.5$<br>$C_2H_4$ | $SiH_4 + SiF_4 = 150$ | $SiH_4:SiF_4:C_2H_4$ | 0.18 | 0.5 |
| 12-7 | $SiH_4/He = 0.5$<br>$SiF_4/He = 0.5$<br>$C_2H_4$ | $SiH_4 + SiF_4 = 15$ | $SiH_4:SiF_4:C_2H_4 = 0.3:0.1:9.6$ | 0.18 | 0.3 |
| 12-8 | $SiH_4/He = 0.5$<br>$SiF_4/He = 0.5$<br>$C_2H_4$ | $SiH_4 + SiF_4 = 150$ | $SiH_4:SiF_4:C_2H_4 = 3:3:4$ | 0.18 | 1.5 |

TABLE 8

| Conditions for preparation of the fourth layer region (M) | Sample No./Evaluation | | | | | | | | |
|---|---|---|---|---|---|---|---|---|---|
| 12-1 | 12-201<br>o o | 12-301<br>o o | 12-401<br>o o | 12-501<br>o o | 12-601<br>o o | 12-701<br>o o | 12-801<br>o o | 12-901<br>o o | 12-1001<br>o o |
| 12-2 | 12-202<br>o o | 12-302<br>o o | 12-402<br>o o | 12-502<br>o o | 12-602<br>o o | 12-702<br>o o | 12-802<br>o o | 12-902<br>o o | 12-1002<br>o o |
| 12-3 | 12-203<br>o o | 12-303<br>o o | 12-403<br>o o | 12-503<br>o o | 12-603<br>o o | 12-703<br>o o | 12-803<br>o o | 12-903<br>o o | 12-1003<br>o o |
| 12-4 | 12-204<br>◎ ◎ | 12-304<br>◎ ◎ | 12-404<br>◎ ◎ | 12-504<br>◎ ◎ | 12-604<br>◎ ◎ | 12-704<br>◎ ◎ | 12-804<br>◎ ◎ | 12-904<br>◎ ◎ | 12-1004<br>◎ ◎ |
| 12-5 | 12-205<br>◎ ◎ | 12-305<br>◎ ◎ | 12-405<br>◎ ◎ | 12-505<br>◎ ◎ | 12-605<br>◎ ◎ | 12-705<br>◎ ◎ | 12-805<br>◎ ◎ | 12-905<br>◎ ◎ | 12-1005<br>◎ ◎ |
| 12-6 | 12-206<br>◎ ◎ | 12-306<br>◎ ◎ | 12-406<br>◎ ◎ | 12-506<br>◎ ◎ | 12-606<br>◎ ◎ | 12-706<br>◎ ◎ | 12-806<br>◎ ◎ | 12-906<br>◎ ◎ | 12-1006<br>◎ ◎ |
| 12-7 | 12-207<br>o o | 12-307<br>o o | 12-407<br>o o | 12-507<br>o o | 12-607<br>o o | 12-707<br>o o | 12-807<br>o o | 12-907<br>o o | 12-1007<br>o o |
| 12-8 | 12-208<br>o o | 12-308<br>o o | 12-408<br>o o | 12-508<br>o o | 12-608<br>o o | 12-708<br>o o | 12-808<br>o o | 12-908<br>o o | 12-1008<br>o o |

| Sample No. | |
|---|---|
| Evaluation of overall image quality | Evaluation of durability |

Evaluation standards:
◎ . . Excellent
. . . Good

TABLE 9

| Sample No. | 1301 | 1302 | 1303 | 1304 | 1305 | 1306 | 1307 |
|---|---|---|---|---|---|---|---|
| Si:C target (area ratio) | 9:1 | 6.5:3.5 | 4:6 | 2:8 | 1:9 | 0.5:9.5 | 0.2:9.8 |
| Si:C (content ratio) | 9.7:0.3 | 8.8:1.2 | 7.3:2.7 | 4.8:5.2 | 3:7 | 2:8 | 0.8:9.2 |
| Image quality evaluation | Δ | o | ◎ | ◎ | o | Δ | x |

◎: Very good
o: Good
Δ: Practically satisfactory
x: Image defect formed

TABLE 10

| Sample No. | 1401 | 1402 | 1403 | 1404 | 1405 | 1406 | 1407 | 1408 |
|---|---|---|---|---|---|---|---|---|
| $SiH_4$:$C_2H_4$ (flow rate ratio) | 9:1 | 6:4 | 4:6 | 2:8 | 1:9 | 0.5:9.5 | 0.35:9.65 | 0.2:9.8 |
| Si:C (content ratio) | 9:1 | 7:3 | 5.5:4.5 | 4:6 | 3:7 | 2:8 | 1.2:8.8 | 0.8:9.2 |
| Image quality evaluation | Δ | o | ◎ | ◎ | ◎ | o | Δ | x |

◎: Very good
o: Good
Δ: Practically satisfactory
x: Image defect formed

TABLE 11

| Sample No. | 1501 | 1502 | 1503 | 1054 | 1505 | 1506 | 1507 | 1508 |
|---|---|---|---|---|---|---|---|---|
| $SiH_4$:$SiF_4$:$C_2H_4$ (flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (content ratio) | 9:1 | 7:3 | 5.5:4.5 | 4:6 | 3:7 | 2:8 | 1.2:8.8 | 0.8:9.2 |
| Image quality evaluation | Δ | o | ◎ | ◎ | ◎ | o | Δ | x |

◎: Very good
o: Good
Δ: Practically satisfactory
x: Image defect formed

TABLE 12

| Sample No. | Thickness (μ) of the fourth layer region (M) | Results |
|---|---|---|
| 1601 | 0.001 | Image defect liable to be formed |
| 1602 | 0.02 | No image defect formed after repetition for 20,000 times |

TABLE 12-continued

| Sample No. | Thickness (μ) of the fourth layer region (M) | Results |
|---|---|---|
| 1603 | 0.05 | Stable for 50,000 times repetition |
| 1604 | 1 | Stable for 200,000 times repetition |

TABLE 13

| Layer constitution | Gases employed | Flow rate (SCCM) | Flow rate ratio | Discharging power (W/cm²) | Layer formation speed (Å/sec) | Layer thickness (μ) | Substrate temperature (°C.) |
|---|---|---|---|---|---|---|---|
| First layer | $SiH_4$/He = 0.05 $GeH_4$/He = 0.05 | $SiH_4$ + $GeH_4$ = 50 | $SiH_4$/$GeH_4$ = 1 | 0.18 | 5 | 0.1 | 450 |
| Second layer | $SiH_4$/He = 0.05 $GeH_4$/He = 0.05 | $SiH_4$ + $GeH_4$ = 50 | $GeH_4$/$SiH_4$ = 1 ~ 0 | 0.18 | 5 | 9.9 | 250 |
| Third layer | $SiH_4$/He = 0.5 | $SiH_4$ = 200 | | 0.18 | 15 | 10 | 250 |
| Fourth layer | $SiH_4$/He = 0.5 $C_2H_4$ | $SiH_4$ = 100 | $SiH_4$/$C_2H_4$ = 3/7 | 0.18 | 10 | 0.5 | 250 |

TABLE 14

| Layer constitution | Gases employed | Flow rate (SCCM) | Flow rate ratio | Discharging power (W/cm²) | Layer formation speed (Å/sec) | Layer thickness (μ) | Substrate temperature (°C.) |
|---|---|---|---|---|---|---|---|
| First layer | $SiH_4$/He = 0.05 $GeH_4$/He = 0.05 | $SiH_4$ + $GeH_4$ = 50 | $GeH_4$/$SiH_4$ = 1/10 | 0.18 | 5 | 0.1 | 450 |

TABLE 14-continued

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| Second layer | $SiH_4/He$ = 0.05 $GeH_4/He$ = 0.05 | $SiH_4 + GeH_4$ = 50 | $GeH_4/SiH_4$ = 1/10 ~ 0 | 0.18 | 5 | 7.9 | 250 |
| Third layer | $SiH_4/He$ = 0.5 | $SiH_4$ = 200 | | 0.18 | 15 | 10 | 250 |
| Fourth layer | $SiH_4/He$ = 0.5 $C_2H_4$ | $SiH_4$ = 100 | $SiH_4/C_2H_4$ = 1/9 | 0.18 | 10 | 0.5 | 250 |

TABLE 15

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| First layer | $SiH_4/He$ = 0.05 $GeH_4/He$ = 0.05 | $SiH_4 + GeH_4$ = 50 | $GeH_4/SiH_4$ = 4/10 | 0.18 | 5 | 0.1 | 450 |
| Second layer | $SiH_4/He$ = 0.05 $GeH_4/He$ = 0.05 | $SiH_4 + GeH_4$ = 50 | $GeH_4/SiH_4$ = 4/10 ~ 2/1000 | 0.18 | 5 | 1.9 | 250 |
| Third layer | $SiH_4/He$ = 0.5 | $SiH_4$ = 200 | | 0.18 | 15 | 20 | 250 |
| Fourth layer | $SiH_4/He$ = 0.5 $C_2H_4$ | $SiH_4$ = 100 | $SiH_4/C_2H_4$ = 3/7 | 0.18 | 10 | 0.5 | 250 |

TABLE 16

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| First layer | $SiH_4/He$ = 0.05 $GeH_4/He$ = 0.05 | $SiH_4 + GeH_4$ = 50 | $GeH_4/SiH_4$ = 3/10 | 0.18 | 5 | 0.1 | 450 |
| Second layer | $SiH_4/He$ = 0.05 $GeH_4/He$ = 0.05 | $SiH_4 + GeH_4$ = 50 | $GeH_4/SiH_4$ = 3/10 ~ 0 | 0.18 | 5 | 1.9 | 250 |
| Third layer | $SiH_4/He$ = 0.5 | $SiH_4$ = 200 | | 0.18 | 15 | 15 | 250 |
| Fourth layer | $SiH_4/He$ = 0.5 $C_2H_4$ | $SiH_4$ = 100 | $SiH_4/C_2H_4$ = 3/7 | 0.18 | 10 | 0.5 | 250 |

TABLE 17

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| First layer | $SiH_4/He$ = 0.05 $GeH_4/He$ = 0.05 | $SiH_4 + GeH_4$ = 50 | $GeH_4/SiH_4$ = 8/10 | 0.18 | 5 | 0.1 | 450 |
| Second layer | $SiH_4/He$ = 0.05 $GeH_4/He$ = 0.05 | $SiH_4 + GeH_4$ = 50 | $GeH_4/SiH_4$ = 8/10 ~ 0 | 0.18 | 5 | 0.7 | 250 |
| Third layer | $SiH_4/He$ = 0.5 | $SiH_4$ = 200 | | 0.18 | 15 | 20 | 250 |
| Fourth layer | $SiH_4/He$ = 0.5 $C_2H_4$ | $SiH_4$ = 100 | $SiH_4/C_2H_4$ = 1/9 | 0.18 | 10 | 0.5 | 250 |

TABLE 18

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| First layer | $SiH_4/He$ = 0.05 $GeH_4/He$ = 0.05 | $SiH_4 + GeH_4$ = 50 | $GeH_4/SiH_4$ = 1 | 0.18 | 5 | 0.1 | 450 |
| Second layer | $SiH_4/He$ = 0.05 $GeH_4/He$ = 0.05 | $SiH_4 + GeH_4$ = 50 | $GeH_4/SiH_4$ = 1 ~ 0 | 0.18 | 5 | 7.9 | 250 |
| Third layer | $SiH_4/He$ = 0.5 | $SiH_4$ = 200 | | 0.18 | 15 | 15 | 250 |
| Fourth | $SiH_4/He$ = 0.5 | $SiH_4$ = 100 | $SiH_4/C_2H_4$ = 3/7 | 0.18 | 10 | 0.5 | 250 |

TABLE 18-continued

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| layer | $C_2H_4$ | | | | | | |

TABLE 19

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| First layer | $SiH_4/He = 0.05$ $GeH_4/He = 0.05$ | $SiH_4 + GeH_4 = 50$ | $GeH_4/SiH_4 = 1/10$ | 0.18 | 5 | 0.1 | 450 |
| Second layer | $SiH_4/He = 0.05$ $GeH_4/He = 0.05$ | $SiH_4 + GeH_4 = 50$ | $GeH_4/SiH_4 = 1/10 \sim 0$ | 0.18 | 5 | 8 | 250 |
| Third layer | $SiH_4/He = 0.5$ | $SiH_4 = 200$ | | 0.18 | 15 | 10 | 250 |
| Fourth layer | $SiH_4/He = 0.5$ $C_2H_4$ | $SiH_4 = 100$ | $SiH_4/C_2H_4 = 1/9$ | 0.18 | 10 | 0.5 | 250 |

TABLE 20

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| First layer | $Si_2H_6/He = 0.05$ $GeH_4/He = 0.05$ | $Si_2H_6 + GeH_4 = 50$ | $GeH_4/Si_2H_6 = 1$ | 0.18 | 5 | 0.1 | 450 |
| Second layer | $Si_2H_6/He = 0.05$ $GeH_4/He = 0.05$ | $Si_2H_6 + GeH_4 = 50$ | $GeH_4/Si_2H_6 = 1 \sim 0$ | 0.18 | 5 | 10 | 250 |
| Third layer | $SiH_4/He = 0.5$ | $SiH_4 = 200$ | | 0.18 | 15 | 10 | 250 |
| Fourth layer | $SiH_4/He = 0.5$ $C_2H_4$ | $SiH_4 = 100$ | $SiH_4/C_2H_4 = 3/7$ | 0.18 | 10 | 0.5 | 250 |

TABLE 21

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| First layer | $SiF_4/He = 0.05$ $GeH_4/He = 0.05$ | $SiF_4 + GeH_4 = 50$ | $GeH_4/SiF_4 = 1$ | 0.18 | 5 | 0.1 | 450 |
| Second layer | $SiF_4/He = 0.05$ $GeH_4/He = 0.05$ | $SiF_4 + GeH_4 = 50$ | $GeH_4/SiF_4 = 1 \sim 0$ | 0.18 | 5 | 10 | 250 |
| Third layer | $SiH_4/He = 0.5$ | $SiH_4 = 200$ | | 0.18 | 15 | 10 | 250 |
| Fourth layer | $SiH_4/He = 0.5$ $C_2H_4$ | $SiH_4 = 100$ | $SiH_4/C_2H_4 = 1/9$ | 0.18 | 10 | 0.5 | 250 |

TABLE 22

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| First layer | $SiH_4/He = 0.05$ $SiF_4/He = 0.05$ $GeH_4/He = 0.05$ | $SiH_4 + SiF_4 + GeH_4 = 50$ | $GeH_4/(SiH_4 + SiF_4) = 1$ | 0.18 | 5 | 0.1 | 450 |
| Second layer | $SiH_4/He = 0.05$ $SiF_4/He = 0.05$ $GeH_4/He = 0.05$ | $SiH_4 + SiF_4 + GeH_4 = 50$ | $GeH_4/(SiH_4 + SiF_4) = 1 \sim 0$ | 0.18 | 5 | 10 | 450 |
| Third layer | $SiH_4/He = 0.5$ | $SiH_4 = 200$ | | 0.18 | 15 | 10 | 250 |
| Fourth layer | $SiH_4/He = 0.5$ $C_2H_4$ | $SiH_4 = 100$ | $SiH_4/C_2H_4 = 1/9$ | 0.18 | 10 | 0.5 | 250 |

TABLE 23

| Layer constitution | Gases employed | Flow rate (SCCM) | Flow rate ratio | Discharging power (w/cm²) | Layer formation speed (Å/sec) |
|---|---|---|---|---|---|
| Third layer | $SiH_4/He = 0.5$ $B_2H_6/He = 10^{-3}$ | $SiH_4 = 200$ | $B_2H_6/SiH_4 = 2/10^{-5}$ | 0.18 | 15 |

TABLE 23A

| Sample No. | 1701 | 1702 | 1703 | 1704 | 1705 | 1706 | 1707 | 1708 | 1709 | 1710 |
|---|---|---|---|---|---|---|---|---|---|---|
| Second layer | Example 13 | Example 14 | Example 15 | Example 16 | Example 17 | Example 18 | Example 19 | Example 20 | Example 21 | Example 22 |
| Layer thickness of the third layer (μ) | 10 | 10 | 20 | 15 | 20 | 15 | 10 | 10 | 10 | 10 |
| Evaluation | o | o | ◎ | ◎ | ◎ | ◎ | o | o | o | o |

◎: Excellent
o: Good

TABLE 24

| Layer constitution | Gases employed | Flow rate (SCCM) | Flow rate ratio | Discharging power (W/cm²) | Layer formation speed (Å/sec) |
|---|---|---|---|---|---|
| Third layer | $SiH_4/He = 0.5$ $PH_3/He = 10^{-3}$ | $SiH_4 = 200$ | $PH_3/SiH_4 = 1 \times 10^{-7}$ | 0.18 | 15 |

TABLE 24A

| Sample No. | 1801 | 1802 | 1803 | 1804 | 1805 | 1806 | 1807 | 1808 | 1809 | 1810 |
|---|---|---|---|---|---|---|---|---|---|---|
| Second layer | Example 13 | Example 14 | Example 15 | Example 16 | Example 17 | Example 18 | Example 19 | Example 20 | Example 21 | Example 22 |
| Layer thickness of the third layer (μ) | 10 | 10 | 20 | 15 | 20 | 15 | 10 | 10 | 10 | 10 |
| Evaluation | o | o | ◎ | ◎ | ◎ | ◎ | o | o | o | o |

◎: Excellent
o: Good

TABLE 25

| Condition | gases employed | Flow rate (SCCM) | Flow rate ratio or area ratio | Discharging power (W/cm²) | Layer thickness (μ) |
|---|---|---|---|---|---|
| 25-1 | Ar | 200 | Si wafer:graphite = 1.5:8.5 | 0.3 | 0.5 |
| 25-2 | Ar | 200 | Si wafer:graphite = 0.5:9.5 | 0.3 | 0.3 |
| 25-3 | Ar | 200 | Si wafer:graphite = 6:4 | 0.3 | 1.0 |
| 25-4 | $SiH_4/He = 1$ $C_2H_4$ | $SiH_4 = 15$ | $SiH_4:C_2H_4 = 0.4:9.6$ | 0.18 | 0.3 |
| 25-5 | $SiH_4/He = 0.5$ $C_2H_4$ | $SiH_4 = 100$ | $SiH_4:C_2H_4 = 5:5$ | 0.18 | 1.5 |
| 25-6 | $SiH_4/He = 0.5$ $SiF_4/He = 0.5$ $C_2H_4$ | $SiH_4 + SiF_4 = 150$ | $SiH_4:SiF_4:C_2H_4 = 1.5:1.5:7$ | 0.18 | 0.5 |
| 25-7 | $SiH_4/He = 0.5$ $SiF_4/He = 0.5$ $C_2H_4$ | $SiH_4 + SiF_4 = 15$ | $SiH_4:SiF_4:C_2H_4 = 0.3:0.1:9.6$ | 0.18 | 0.3 |
| 25-8 | $SiH_4/He = 0.5$ $SiF_4/He = 0.5$ $C_2H_4$ | $SiH_4 + SiF_4 = 150$ | $SiH_4:SiF_4:C_2H_2 = 3:3:4$ | 0.18 | 1.5 |

TABLE 26

| Conditions for preparation of the fourth layer region (M) | Sample No./Evaluation | | | | | | | | |
|---|---|---|---|---|---|---|---|---|---|
| 25-1 | 25-201 | 25-301 | 25-401 | 25-501 | 25-601 | 25-701 | 25-801 | 25-901 | 25-1001 |
| | o o | o o | o o | o o | o o | o o | o o | o o | o o |
| 25-2 | 25-202 | 25-302 | 25-402 | 25-502 | 25-602 | 25-702 | 25-802 | 25-902 | 25-1002 |
| | o o | o o | o o | o o | o o | o o | o o | o o | o o |

TABLE 26-continued

| | | | | | | | | | |
|---|---|---|---|---|---|---|---|---|---|
| 25-3 | 25-203 | 25-303 | 25-403 | 25-503 | 25-603 | 25-703 | 25-803 | 25-903 | 25-1003 |
| | o o | o o | o o | o o | o o | o o | o o | o o | o o |
| 25-4 | 25-204 | 25-304 | 25-404 | 25-504 | 25-604 | 25-704 | 25-804 | 25-904 | 25-1004 |
| | ◎ ◎ | ◎ ◎ | ◎ ◎ | ◎ ◎ | ◎ ◎ | ◎ ◎ | ◎ ◎ | ◎ ◎ | ◎ ◎ |
| 25-5 | 25-205 | 25-305 | 25-405 | 25-505 | 25-605 | 25-705 | 25-805 | 25-905 | 25-1005 |
| | ◎ ◎ | ◎ ◎ | ◎ ◎ | ◎ ◎ | ◎ ◎ | ◎ ◎ | ◎ ◎ | ◎ ◎ | ◎ ◎ |
| 25-6 | 25-206 | 25-306 | 25-406 | 25-506 | 25-606 | 25-706 | 25-806 | 25-906 | 25-1006 |
| | ◎ ◎ | ◎ ◎ | ◎ ◎ | ◎ ◎ | ◎ ◎ | ◎ ◎ | ◎ ◎ | ◎ ◎ | ◎ ◎ |
| 25-7 | 25-207 | 25-307 | 25-407 | 25-507 | 25-607 | 25-707 | 25-807 | 25-907 | 25-1007 |
| | o o | o o | o o | o o | o o | o o | o o | o o | o o |
| 25-8 | 25-208 | 25-308 | 25-408 | 25-508 | 25-608 | 25-708 | 25-808 | 25-908 | 25-1008 |
| | o o | o o | o o | o o | o o | o o | o o | o o | o o |

| Sample No. | |
|---|---|
| Evaluation of overall image quality | Evaluation of durability |

Evaluation standards:
◎ . . . Excellent
o . . . Good

TABLE 27

| Sample No. | 1901 | 1902 | 1903 | 1904 | 1905 | 1906 | 1907 |
|---|---|---|---|---|---|---|---|
| Si:C target (area ratio) | 9:1 | 6.5:3.5 | 4:6 | 2:8 | 1:9 | 0.5:9.5 | 0.2:9.8 |
| Si:C (content ratio) | 9.7:0.3 | 8.8:1.2 | 7.3:2.7 | 4.8:5.2 | 3:7 | 2:8 | 0.8:9.2 |
| Image quality evaluation | Δ | o | ◎ | ◎ | o | Δ | x |

◎: Very good
o: Good
Δ: Practically satisfactory
x: Image defect formed

TABLE 28

| Sample No. | 2001 | 2002 | 2003 | 2004 | 2005 | 2006 | 2007 | 2008 |
|---|---|---|---|---|---|---|---|---|
| $SiH_4$:$C_2H_4$ (flow rate ratio) | 9:1 | 6:4 | 4:6 | 2:8 | 1:9 | 0.5:9.5 | 0.35:9.65 | 0.2:9.8 |
| Si:C (content ratio) | 9:1 | 7:3 | 5.5:4.5 | 4:6 | 3:7 | 2:8 | 1.2:8.8 | 0.8:9.2 |
| Image quality evaluation | Δ | o | ◎ | ◎ | ◎ | o | Δ | x |

◎: Very good
o: Good
Δ: Practically satisfactory
x: Image defect formed

TABLE 29

| Sample No. | 2101 | 2102 | 2103 | 2104 | 2105 | 2106 | 2107 | 2108 |
|---|---|---|---|---|---|---|---|---|
| $SiH_4$:$SiF_4$:$C_2H_4$ (flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (content ratio) | 9:1 | 7:3 | 5.5:4.5 | 4:6 | 3:7 | 2:8 | 1.2:8.8 | 0.8:9.2 |
| Image quality evaluation | Δ | O | ◎ | ◎ | ◎ | O | Δ | x |

◎: Very good
: Good
Δ: Practically satisfactory
x: Image defect formed

TABLE 30

| Sample No. | Thickness (μ) of the fourth layer region (M) | Results |
|---|---|---|
| 2201 | 0.001 | Image defect liable to be formed |
| 2202 | 0.02 | No image defect formed after repetition for 20,000 times |

TABLE 30-continued

| Sample No. | Thickness (μ) of the fourth layer region (M) | Results |
|---|---|---|
| 2203 | 0.05 | Stable for 50,000 times repetition |
| 2204 | 1 | Stable for 200,000 times repetition |

TABLE 31

| Layer constitution | Gases employed | Flow rate (SCCM) | Flow rate ratio | Discharging power ($W/cm^2$) | Layer formation speed (Å/sec) | Layer thickness (μ) | Substrate temperature |
|---|---|---|---|---|---|---|---|
| First layer | $GeH_4/He = 0.05$ | $GeH_4 = 10$ | | 0.2 | 3 | 0.1 | 450 |
| Second layer | $SiH_4/He = 0.05$<br>$GeH_4/He = 0.05$ | $SiH_4 + GeH_4 = 50$ | $GeH_4/SiH_4 = 3/10$<br>$B_2H_6/(GeH_4 + SiH_4) = 3 \times 10^{-3}$ | 0.18 | 5 | 1 | 250 |
| Third layer | $SiH_4/He = 0.5$ | $SiH_4 = 200$ | | 0.18 | 15 | 20 | 250 |
| Fourth layer | $SiH_4/He = 0.5$<br>$C_2H_4$ | $SiH_4 = 100$ | $SiH_4/C_2H_4 = 3/7$ | 0.18 | 10 | 0.5 | 250 |

TABLE 32

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| First layer | $SiH_4/He = 0.05$<br>$GeH_4/He = 0.05$ | $SiH_4 + GeH_4 = 50$ | $GeH_4/SiH_4 = 5/10$<br>$B_2H_6/(GeH_4 + SiH_4) = 3 \times 10^{-3}$ | 0.2 | 8 | 0.2 | 450 |
| Second layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 1/10$<br>$B_2H_6/(GeH_4 + SiH_4) = 3 \times 10^{-3}$ | 0.18 | 5 | 1 | 250 |
| Third layer | $SiH_4/He = 0.5$<br>$GeH_4/He = 0.05$ | $SiH_4 + GeH_4 = 50$ | $GeH_4/SiH_4 = 1/10$ | 0.18 | 5 | 19 | 250 |
| Fourth layer | $SiH_4/He = 0.5$ | $SiH_4 = 200$ | | 0.18 | 15 | 5 | 250 |
| Fifth layer | $SiH_4/He = 0.5$<br>$C_2H_4$ | $SiH_4 = 100$ | $SiH_4/C_2H_4 = 1/9$ | 0.18 | 10 | 0.5 | 250 |

TABLE 33

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| First layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 5/10$<br>$B_2H_6/(GeH_4 + SiH_4) = 5 \times 10^{-3}$ | 0.18 | 5 | 0.1 | 450 |
| Second layer | $SiH_4/He = 0.05$<br>$GeH_4/He = 0.05$<br>$B_2H_6/He = 10^{-3}$ | $SiH_4 + GeH_4 = 50$ | $GeH_4/SiH_4 = 3/10$<br>$B_2H_6/(GeH_4 + SiH_4) = 5 \times 10^{-3}$ | 0.18 | 5 | 2 | 250 |
| Third layer | $SiH_4/He = 0.5$<br>$B_2H_6/He = 10^{-3}$ | $SiH_4 = 200$ | $B_2H_6/SiH_4 = 2 \times 10^{-4}$ | 0.18 | 15 | 20 | 250 |
| Fourth layer | $SiH_4/He = 0.5$<br>$C_2H_4$ | $SiH_4 = 100$ | $SiH_4/C_2H_4 = 1/9$ | 0.18 | 10 | 0.5 | 250 |

TABLE 34

| Sample No. | 3401 | 3402 | 3403 | 3404 | 3405 | 3406 | 3407 | 3408 | 3409 | 3410 | 3411 |
|---|---|---|---|---|---|---|---|---|---|---|---|
| $GeH_4/SiH_4$ Flow rate ratio | 5/100 | 1/10 | 2/10 | 4/10 | 5/10 | 7/10 | 8/10 | 1/1 | 10/1 | 100/1 | $GeH_4$ 100% |
| Ge content (atomic %) | 4.3 | 8.4 | 15.4 | 26.7 | 32.3 | 38.9 | 42 | 47.6 | 70.4 | 98.1 | 100% |
| Evaluation | ○ | ○ | ○ | ○ | ◎ | ◎ | ◎ | ◎ | ◎ | ◎ | ◎ |

◎: Excellent
○ : Good

TABLE 35

| Sample No. | 3501 | 3502 | 3503 | 3504 | 3505 | 3506 | 3507 | 3508 |
|---|---|---|---|---|---|---|---|---|
| Layer thickness | 30Å | 500Å | 0.1μ | 0.3μ | 0.8μ | 3μ | 4μ | 5μ |

TABLE 35-continued

| Sample No. | 3501 | 3502 | 3503 | 3504 | 3505 | 3506 | 3507 | 3508 |
|---|---|---|---|---|---|---|---|---|
| Evaluation | Δ | ○ | ◎ | ◎ | ◎ | ○ | ○ | Δ |

◎: Excellent
○ : Good
Δ: Practically satisfactory

TABLE 36

| Layer constitution | Gases employed | Flow rate (SCCM) | Flow rate ratio | Discharging power (W/cm$^2$) | Layer formation speed (Å/sec) | Layer thickness (μ) | Substrate temperature (°C.) |
|---|---|---|---|---|---|---|---|
| First layer | $SiH_4/He = 0.05$ $GeH_4/He = 0.05$ $B_2H_6/He = 10^{-3}$ | $SiH_4 + GeH_4 = 50$ | $GeH_4/SiH_4 = 10/1$ $B_2H_6/(GeH_4 + SiH_4) = 5 \times 10^{-3}$ | 0.18 | 5 | 0.1 | 450 |
| Second layer | $SiH_4/He = 0.05$ $GeH_4/He = 0.05$ $B_2H_6/He = 10^{-3}$ | $SiH_4 + GeH_4 = 50$ | $GeH_4/SiH_4 = 5/10$ $B_2H_6/(GeH_4 + SiH_4) = 5 \times 10^{-3}$ | 0.18 | 5 | 2 | 250 |
| Third layer | $SiH_4/He = 0.5$ $PH_3/He = 10^{-1}$ | $SiH_4 = 200$ | $PH_3/SiH_4 = 9 \times 10^{-5}$ | 0.18 | 15 | 20 | 250 |
| Fourth layer | $SiH_4/He = 0.5$ $C_2H_4$ | $SiH_4 = 100$ | $SiH_4/C_2H_4 = 3/7$ | 0.18 | 10 | 0.5 | 250 |

TABLE 37

| Layer constitution | Gases employed | Flow rate (SCCM) | Flow rate ratio | Discharging power (W/cm$^2$) | Layer formation speed (Å/sec) | Layer thickness (μ) | Substrate temperature (°C.) |
|---|---|---|---|---|---|---|---|
| First layer | $SiH_4/He = 0.05$ $GeH_4/He = 0.05$ $PH_3/He = 10^{-3}$ | $SiH_4 + GeH_4 = 50$ | $GeH_4/SiH_4 = 10/1$ $PH_3/(GeH_4 + SiH_4) = 8 \times 10^{-4}$ | 0.18 | 5 | 0.1 | 450 |
| Second layer | $SiH_4/He = 0.05$ $GeH_4/He = 0.05$ $PH_3/He = 10^{-3}$ | $SiH_4 + GeH_4 = 50$ | $GeH_4/SiH_4 = 5/10$ $PH_3/(GeH_4 + SiH_4) = 8 \times 10^{-4}$ | 0.18 | 5 | 15 | 250 |
| Third layer | $SiH_4/He = 0.5$ $B_2H_6/He = 10^{-3}$ | $SiH_4 = 200$ | $B_2H_6/SiH_4 = 1 \times 10^{-4}$ | 0.18 | 15 | 5 | 250 |
| Fourth layer | $SiH_4/He = 0.5$ $C_2H_4$ | $SiH_4 = 100$ | $SiH_4/C_2H_4 = 3/7$ | 0.18 | 10 | 0.5 | 250 |

TABLE 38

| Layer constitution | Gases employed | Flow rate (SCCM) | Flow rate ratio | Discharging power (W/cm$^2$) | Layer formation speed (Å/sec) | Layer thickness (μ) | Subtrate temperature (°C.) |
|---|---|---|---|---|---|---|---|
| First layer | $SiH_4/He = 0.05$ $GeH_4/He = 0.05$ $PH_3/He = 10^{-3}$ | $SiH_4 + GeH_4 = 50$ | $GeH_4/SiH_4 = 10/1$ $PH_3/(GeH_4 + SiH_4) = 9 \times 10^{-4}$ | 0.18 | 5 | 0.3 | 450 |
| Second layer | $SiH_4/He = 0.05$ $GeH_4/He = 0.05$ $PH_3/He = 10^{-3}$ | $SiH_4 + GeH_4 = 50$ | $GeH_4/SiH_4 = 3/10$ $PH_3/(GeH_4 + SiH_4) = 9 \times 10^{-4}$ | 0.18 | 5 | 1 | 250 |
| Third layer | $SiH_4/He = 0.5$ $B_2H_6/He = 10^{-3}$ | $SiH_4 = 200$ | $B_2H_6/SiH_4 = 9 \times 10^{-4}$ | 0.18 | 15 | 15 | 250 |
| Fourth layer | $SiH_4/He = 0.5$ $C_2H_4$ | $SiH_4 = 100$ | $SiH_4/C_2H_4 = 1/9$ | 0.18 | 10 | 0.5 | 250 |

TABLE 39

| Layer constitution | Gases employed | Flow rate (SCCM) | Flow rate ratio | Discharging power (W/cm$^2$) | Layer formation speed (Å/sec) | Layer thickness (μ) | Substrate temperature (°C.) |
|---|---|---|---|---|---|---|---|
| First layer | $SiH_4/He = 0.05$ $GeH_4/He = 0.05$ $B_2H_6/He = 10^{-3}$ | $SiH_4 + GeH_4 = 50$ | $GeH_4/SiH_4 = 10/1$ $B_2H_6/(GeH_4 + SiH_4) = 9 \times 10^{-4}$ | 0.18 | 7 | 1 | 450 |
| Second layer | $SiH_4/He = 0.05$ $GeH_4/He = 0.05$ $B_2H_6/He = 10^{-3}$ | $SiH_4 + GeH_4 = 50$ | $GeH_4/SiH_4 = 1/10$ $B_2H_6/(GeH_4 + SiH_4) = 9 \times 10^{-4}$ | 0.18 | 5 | 15 | 250 |
| Third layer | $SiH_4/He = 0.5$ $B_2H_6/He = 10^{-3}$ | $SiH_4 = 200$ | $B_2H_6/SiH_4 = 9 \times 10^{-4}$ | 0.18 | 15 | 5 | 250 |
| Fourth layer | $SiH_4/He = 0.5$ $C_2H_4$ | $SiH_4 = 100$ | $SiH_4/C_2H_4 = 1/9$ | 0.18 | 10 | 0.5 | 250 |

TABLE 40

| Layer constitution | Gases employed | Flow rate (SCCM) | Flow rate ratio | Discharging power ($W/cm^2$) | Layer formation speed (Å/sec) | Layer thickness (μ) | Substrate temperature (°C.) |
|---|---|---|---|---|---|---|---|
| First layer | $SiH_4/He$ = 0.05<br>$GeH_4/He$ = 0.05<br>$B_2H_6/He$ = $10^{-3}$ | $SiH_4 + GeH_4$ = 50 | $GeH_4/SiH_4$ = 100/1<br>$B_2H_6/(GeH_4 + SiH_4)$ = $2 \times 10^{-4}$ | 0.18 | 7 | 0.1 | 450 |
| Second layer | $SiH_4/He$ = 0.05<br>$GeH_4/He$ = 0.05<br>$B_2H_6/He$ = $10^{-3}$ | $SiH_4 + GeH_4$ = 50 | $GeH_4/SiH_4$ = 3/10<br>$B_2H_6/(GeH_4 + SiH_4)$ = $2 \times 10^{-4}$ | 0.18 | 5 | 2 | 250 |
| Third layer | $SiH_4/He$ = 0.5<br>$B_2H_6/He$ = $10^{-3}$ | $SiH_4$ = 200 | $B_2H_6/SiH_4$ = $2 \times 10^{-4}$ | 0.18 | 15 | 20 | 250 |
| Fourth layer | $SiH_4/He$ = 0.5<br>$C_2H_4$ | $SiH_4$ = 100 | $SiH_4/C_2H_4$ = 1/9 | 0.18 | 10 | 0.5 | 250 |

TABLE 41

| Condition | gases employed | Flow rate (SCCM) | Flow rate ratio or area ratio | Discharging power ($W/cm^2$) | Layer thickness (μ) |
|---|---|---|---|---|---|
| 42-1 | Ar | 200 | Si wafer:graphite = 1.5:8.5 | 0.3 | 0.5 |
| 42-2 | Ar | 200 | Si wafer:graphite = 0.5:9.5 | 0.3 | 0.3 |
| 42-3 | Ar | 200 | Si wafer:graphite = 6:4 | 0.3 | 1.0 |
| 42-4 | $SiH_4/He$ = 1<br>$C_2H_4$ | $SiH_4$ = 15 | $SiH_4:C_2H_4$ = 0.4:9.6 | 0.18 | 0.3 |
| 42-5 | $SiH_4/He$ = 0.5<br>$C_2H_4$ | $SiH_4$ = 100 | $SiH_4:C_2H_4$ = 5:5 | 0.18 | 1.5 |
| 42-6 | $SiH_4/He$ = 0.5<br>$SiF_4/He$ = 0.5<br>$C_2H_4$ | $SiH_4 + SiF_4$ = 150 | $SiH_4:SiF_4:C_2H_4$ = 1.5:1.5:7 | 0.18 | 0.5 |
| 42-7 | $SiH_4/He$ = 0.5<br>$SiF_4/He$ = 0.5<br>$C_2H_4$ | $SiH_4 + SiF_4$ = 15 | $SiH_4:SiF_4:C_2H_4$ = 0.3:0.1:9.6 | 0.18 | 0.3 |
| 42-8 | $SiH_4/He$ = 0.5<br>$SiF_4/He$ = 0.5<br>$C_2H_4$ | $SiH_4 + SiF_4$ = 150 | $SiH_4:SiF_4:C_2H_4$ = 3:3:4 | 0.18 | 1.5 |

TABLE 42

| Conditions for preparation of the fourth layer region (M) | Sample No./Evaluation | | | | | | | | |
|---|---|---|---|---|---|---|---|---|---|
| 42-1 | 42-201<br>o o | 42-301<br>o o | 42-401<br>o o | 42-501<br>o o | 42-601<br>o o | 42-701<br>o o | 42-801<br>o o | 42-901<br>o o | 42-1001<br>o o |
| 42-2 | 42-202<br>o o | 42-302<br>o o | 42-402<br>o o | 42-502<br>o o | 42-602<br>o o | 42-702<br>o o | 42-802<br>o o | 42-902<br>o o | 42-1002<br>o o |
| 42-3 | 42-203<br>o o | 42-303<br>o o | 42-403<br>o o | 42-503<br>o o | 42-603<br>o o | 42-703<br>o o | 42-803<br>o o | 42-903<br>o o | 42-1003<br>o o |
| 42-4 | 42-204<br>◎ ◎ | 42-304<br>◎ ◎ | 42-404<br>◎ ◎ | 42-504<br>◎ ◎ | 42-604<br>◎ ◎ | 42-704<br>◎ ◎ | 42-804<br>◎ ◎ | 42-904<br>◎ ◎ | 42-1004<br>◎ ◎ |
| 42-5 | 42-205<br>◎ ◎ | 42-305<br>◎ ◎ | 42-405<br>◎ ◎ | 42-505<br>◎ ◎ | 42-605<br>◎ ◎ | 42-705<br>◎ ◎ | 42-805<br>◎ ◎ | 42-905<br>◎ ◎ | 42-1005<br>◎ ◎ |
| 42-6 | 42-206<br>◎ ◎ | 42-306<br>◎ ◎ | 42-406<br>◎ ◎ | 42-506<br>◎ ◎ | 42-606<br>◎ ◎ | 42-706<br>◎ ◎ | 42-806<br>◎ ◎ | 42-906<br>◎ ◎ | 42-1006<br>◎ ◎ |
| 42-7 | 42-207<br>o o | 42-307<br>o o | 42-407<br>o o | 42-507<br>o o | 42-607<br>o o | 42-707<br>o o | 42-807<br>o o | 42-907<br>o o | 42-1007<br>o o |
| 42-8 | 42-208<br>o o | 42-308<br>o o | 42-408<br>o o | 42-508<br>o o | 42-608<br>o o | 42-708<br>o o | 42-808<br>o o | 42-908<br>o o | 42-1008<br>o o |

| Sample No. | |
|---|---|
| Evaluation of overall image quality | Evaluation of durability |

Evaluation standards:
Excellent
o Good

TABLE 43

| Sample No. | 4301 | 4302 | 4303 | 4304 | 4305 | 4306 | 4307 |
|---|---|---|---|---|---|---|---|
| Si:C target (area ratio) | 9:1 | 6.5:3.5 | 4:6 | 2:8 | 1:9 | 0.5:9.5 | 0.2:9.8 |
| Si:C (content ratio) | 9.7:0.3 | 8.8:1.2 | 7.3:2.7 | 4.8:5.2 | 3:7 | 2:8 | 0.8:9.2 |
| Image quality evaluation | Δ | o | ◎ | ◎ | o | Δ | x |

◎: Very good
o: Good
Δ: Practically satisfactory
x: Image defect formed

TABLE 44

| Sample No. | 4401 | 4402 | 4403 | 4404 | 4405 | 4406 | 4407 | 4408 |
|---|---|---|---|---|---|---|---|---|
| $SiH_4$:$C_2H_4$ (flow rate ratio) | 9:1 | 6:4 | 4:6 | 2:8 | 1:9 | 0.5:9.5 | 0.35:9.65 | 0.2:9.8 |
| Si:C (content ratio) | 9:1 | 7:3 | 5.5:4.5 | 4:6 | 3:7 | 2:8 | 1.2:8.8 | 0.8:9.2 |
| Image quality evaluation | Δ | o | ◎ | ◎ | ◎ | o | Δ | x |

◎: Very good
o: Good
Δ: Practically satisfactory
x: Image defect formed

TABLE 45

| Sample No. | 4501 | 4502 | 4503 | 4504 | 4505 | 4506 | 4507 | 4508 |
|---|---|---|---|---|---|---|---|---|
| $SiH_4$:$SiF_4$:$C_2H_4$ (Flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (content ratio) | 9:1 | 7:3 | 5.5:4.5 | 4:6 | 3:7 | 2:8 | 1.2:8.8 | 0.8:9.2 |
| Image quality evaluation | Δ | o | ◎ | ◎ | ◎ | o | Δ | x |

◎: Very good
o: Good
Δ: Practically satisfactory
x: Image defect formed

TABLE 46

| Sample No. | Thickness (μ) of the fourth layer region (M) | Results |
|---|---|---|
| 4601 | 0.001 | Image defect liable to be formed |
| 4602 | 0.02 | No image defect formed after repetition for 20,000 times |
| 4603 | 0.05 | Stable for 50,000 times repetition |
| 4604 | 1 | Stable for 200,000 times repetition |

We claim:

1. A photoconductive member, comprising a support for photoconductive member and a light receiving layer with a layer constitution, comprising a first layer region containing at least germanium atoms of which at least a portion is crystallized, a second layer region comprising an amorphous material containing at least silicon atoms and germanium atoms, a third layer region comprising an amorphous material containing at least silicon atoms and exhibiting photoconductivity, and a fourth layer region comprising an amorphous material containing silicon atoms and carbon atoms provided successively in the order mentioned from the said support side.

2. A photoconductive member according to claim 1, wherein hydrogen atoms are contained in either one of the first layer region, the second layer region, the third layer region and the fourth layer region.

3. A photoconductive member according to claim 1, wherein halogen atoms are contained in either one of the first layer region, the second layer region, the third layer region and the fourth layer region.

4. A photoconductive member according to claim 1, wherein the content of germanium atoms contained in the first layer region is in the range of from 1 to $1\times10^6$ atomic ppm.

5. A photoconductive member according to claim 1, wherein the content of germanium atoms contained in the second layer region is in the range of from 1 to $9.5\times10^5$ atomic ppm.

6. A photoconductive member according to claim 1, wherein the layer thickness of the first layer region is in the range of from 30 Å to 50μ.

7. A photoconductive member according to claim 1, wherein the layer thickness of the second layer region is in the range of from 30 Å to 50μ.

8. A photoconductive member according to claim 1, wherein the layer thickness of the third layer region is in the range of from 0.5μ to 90μ.

9. A photoconductive member according to claim 1, wherein the sum of the layer thicknesses of the second layer region and the third layer region is in the range of from 1 to 100μ.

10. A photoconductive member according to claim 1, wherein the content of carbon atoms contained in the fourth layer region is in the range of from $1\times10^{-3}$ to 90 atomic %.

11. A photoconductive member according to claim 1, wherein the distribution of germanium atoms at least in the second layer region is even in the layer thickness direction.

12. A photoconductive member according to claim 1, wherein the distribution of germanium atoms at least within the second layer region is uneven in the layer thickness direction.

13. A photoconductive member according to claim 12, wherein the germanium atoms are contained in the second layer region in a continuous distribution which is more enriched on the support side.

14. A photoconductive member according to claim 1, wherein at least one of the first layer region and the second layer region contains a substance for controlling the conductive characteristics.

15. A photoconductive member according to claim 14, wherein the substance for controlling the conductive characteristics is an atom belonging to the group III of the periodic table.

16. A photoconductive member according to claim 14, wherein the substance for controlling the conductive characteristics is an atom belonging to the group V of the periodic table.

17. A photoconductive member according to claim 14, wherein the amount of the substance for controlling the conductive characteristics is in the range of from 0.01 to $5\times10^5$ atomic ppm.

18. A photoconductive member according to claim 15, wherein the atom belonging to the group III atom of the periodic table is selected from B, Al, Ga, In and Tl.

19. A photoconductive member according to claim 16, wherein the atom belonging to the group V of the periodic table is selected from P, As, Sb and Bi.

* * * * *

UNITED STATES PATENT AND TRADEMARK OFFICE

CERTIFICATE OF CORRECTION

PATENT NO. : 4,532,198

DATED : July 30, 1985

INVENTOR(S) : Keishi Saitoh, et al.

It is certified that error appears in the above-identified patent and that said Letters Patent is hereby corrected as shown below:

Column 1, line 11, "Arts" should be --Art--.
Column 1, line 66, after "cannot" insert --be--.
Column 2, line 15, "may sometimes be ensued" should be --sometimes may ensue--.
Column 3, line 18, "phenomenon" should be --phenomena--.
Column 3, line 19, "no or substantially no" should be --no, or substantially no,--.
Column 4, line 23, "embodiments" should be --embodiment--.
Column 4, line 64, "Cx)Y" should be --Cx)y--.
Column 5, line 19, "opposite to" should be --opposite of--.
Column 5, line 24, "containing also silicon" should be --containing silicon--.
Column 5, line 25, "atoms is" should be --atoms are--.
Column 5, line 48, "layer to" should be --layer of--.
Column 6, line 35, "thirckness" should be --thickness--.
Column 6, line 50, "while the" should be --with the--.
Column 6, line 62, "constant as" should be --constant at--.
Column 8, line 37, "of important" should be --of the important--.
Column 8, line 39, "may" should be --may be--.
Column 9, line 24, delete "layer".
Column 10, line 31, delete "the" (first occurrence).
Column 10, line 36, delete "the" (first occurrence).
Column 10, line 41, delete "be" (second occurrence).
Column 12, line 4, "target of a" should be --target--.
Column 13, line 29, "layer to such" should be --layer of such--.
Column 13, line 61, "working" should be --work--.
Column 15, line 24, "effective" should be --effective of--.
Column 18, line 4, "as an" should be --as a--.
Column 18, line 20, "there may" should be --there may be--.

UNITED STATES PATENT AND TRADEMARK OFFICE

CERTIFICATE OF CORRECTION

PATENT NO. : 4,532,198

DATED : July 30, 1985

INVENTOR(S) : Keishi Saitoh, et al.

It is certified that error appears in the above-identified patent and that said Letters Patent is hereby corrected as shown below:

Column 19, line 21, "should not" should be --should not be--.
Column 19, line 30, delete "the"
Column 19, line 48, "a-$(Si_cC_{1-c})_e$" should be --a-$(Si_dC_{1-d})_e$--.
Column 20, line 37, "from" should be --from an--.
Column 21, line 27, "a" should be --an--.
Column 21, line 28, "a" should be --an--.
Column 22, line 4, "stage," should be --stage--.
Column 22, line 38, "stage," should be --stage--.
Column 25, line 16, "every" should be --any--.
Column 26, line 42, "or" should be --on--.
Column 28, line 66, "25-1009)." should be --25-1008).--.
Column 29, line 12, "every" should be --any--.
Column 32, line 58, "every" should be --any--.
TABLE 7, under "Flow rate ratio or area ratio", "Si wafer: graphite=5:8.5" should be --Si wafer: graphite=1.5:8.5--.
TABLE 7, under "Flow rate ratio or area ratio", after "$SiH_4$:$SiF_4$:$C_2H_4$" insert --=1.5:1.5:7--.
TABLE 8, under "Evaluation standards:", "...Good" should be --O...Good--.
TABLE 11, "1054" should be --1504--.
TABLE 29, ":Good" should be --O:Good--.
TABLE 31, under "Gases employed", below "$GeH_4$/He-0.05" insert --$B_2He$/He=$10^{-3}$--
TABLE 32, under "Gases employed", below "$GeH_4$/He-0.05" insert --$B_2He$/He=$10^{-3}$--
TABLE 36, under "Gases employed", "$PH_3$/He=$10^{-1}$" should be "$PH_3$/He=$10^{-3}$"
Column 53, line 66, "region and" should be --region or--.
Column 54, line 37, "region and" should be --region or--.

UNITED STATES PATENT AND TRADEMARK OFFICE

CERTIFICATE OF CORRECTION

PATENT NO. : 4,532,198

DATED : July 30, 1985

INVENTOR(S) : Keishi Saitoh, et al.

It is certified that error appears in the above-identified patent and that said Letters Patent is hereby corrected as shown below:

Column 56, line 10, "group III atom of" should be --group III of--.

Signed and Sealed this

Ninth Day of December, 1986

*Attest:*

DONALD J. QUIGG

*Attesting Officer* *Commissioner of Patents and Trademarks*